United States Patent
Lee et al.

(10) Patent No.: US 8,689,088 B2
(45) Date of Patent: Apr. 1, 2014

(54) METHOD OF ENCODING DATA USING A LOW DENSITY PARITY CHECK CODE

(75) Inventors: Young Seob Lee, Anyang-si (KR); Min Seok Oh, Anyang-si (KR); Ji Wook Chung, Anyang-si (KR); Sang Gook Kim, Anyang-si (KR); Ki Hyoung Cho, Anyang-si (KR)

(73) Assignee: LG Electronics Inc., Seoul (KR)

( * ) Notice: Subject to any disclaimer, the term of this patent is extended or adjusted under 35 U.S.C. 154(b) by 457 days.

(21) Appl. No.: 12/593,171

(22) PCT Filed: Mar. 27, 2008

(86) PCT No.: PCT/KR2008/001725
§ 371 (c)(1),
(2), (4) Date: Sep. 25, 2009

(87) PCT Pub. No.: WO2008/117994
PCT Pub. Date: Oct. 2, 2008

(65) Prior Publication Data
US 2010/0138719 A1    Jun. 3, 2010

Related U.S. Application Data

(60) Provisional application No. 60/908,379, filed on Mar. 27, 2007, provisional application No. 60/910,190, filed on Apr. 4, 2007, provisional application No. 60/910,630, filed on Apr. 6, 2007, provisional application No. 60/917,867, filed on May 14, 2007.

(30) Foreign Application Priority Data

Jun. 26, 2007  (KR) .................. 10-2007-0063353

(51) Int. Cl.
*H03M 13/00*  (2006.01)
*H03M 13/11*  (2006.01)

(52) U.S. Cl.
CPC .......... *H03M 13/116* (2013.01); *H03M 13/118* (2013.01)
USPC ........................................... 714/781

(58) Field of Classification Search
CPC .......... H03M 13/1148; H03M 13/116; H03M 13/118; H03M 13/1185
See application file for complete search history.

(56) References Cited

U.S. PATENT DOCUMENTS 6,785,863 B2 * 8/2004 Blankenship et al. ........ 714/799
7,020,829 B2   3/2006 Eroz et al.
(Continued)

FOREIGN PATENT DOCUMENTS

KR  10-2005-0100152 A  10/2005
KR  10-2006-0010068 A  2/2006
(Continued)

*Primary Examiner* — Steve Nguyen
(74) *Attorney, Agent, or Firm* — Birch, Stewart, Kolasch & Birch, LLP

(57) ABSTRACT

A method for encoding data using a parity check matrix is disclosed. The method for encoding data using a parity check matrix comprises generating a fourth base matrix by applying a row permutation pattern and a column permutation pattern to rows and columns of a third base matrix, respectively, the third base matrix including a plurality of indexes, each of the plurality of indexes indicating a sub-matrix; generating the parity check matrix by replacing each index of the fourth base matrix with a corresponding sub-matrix; outputting an encoded bit stream by encoding an input bit stream using the generated parity check matrix; and permuting an order of sequences of the encoded bit stream according to an inverse of the column permutation pattern.

10 Claims, 42 Drawing Sheets

(56) References Cited

U.S. PATENT DOCUMENTS

| | | | |
|---|---|---|---|
| 7,243,286 B2 * | 7/2007 | Kim et al. | 714/752 |
| 7,260,763 B2 * | 8/2007 | Sukhobok et al. | 714/758 |
| 7,278,082 B2 * | 10/2007 | Kim et al. | 714/752 |
| 7,343,548 B2 * | 3/2008 | Blankenship et al. | 714/800 |
| 7,395,494 B2 * | 7/2008 | Lee et al. | 714/801 |
| 7,484,159 B2 * | 1/2009 | Kan et al. | 714/755 |
| 7,627,801 B2 * | 12/2009 | Jin et al. | 714/757 |
| 7,793,190 B1 * | 9/2010 | Gray et al. | 714/752 |
| 2005/0229087 A1 | 10/2005 | Kim et al. | |
| 2005/0289437 A1 * | 12/2005 | Oh et al. | 714/758 |
| 2006/0107180 A1 | 5/2006 | Kim et al. | |
| 2006/0156183 A1 | 7/2006 | Kim et al. | |
| 2008/0028271 A1 | 1/2008 | Chen | |

FOREIGN PATENT DOCUMENTS

| | | |
|---|---|---|
| KR | 10-2006-0032807 A | 4/2006 |
| KR | 10-2006-0061145 A | 6/2006 |
| KR | 10-2007-0022569 A | 2/2007 |

* cited by examiner

-PRIOR ART- $$H = \begin{bmatrix} P^{h^b_{00}} & P^{h^b_{01}} & P^{h^b_{02}} & \cdots & P^{h^b_{0n_b}} \\ P^{h^b_{10}} & P^{h^b_{11}} & P^{h^b_{12}} & \cdots & P^{h^b_{1n_b}} \\ \cdots & \cdots & \cdots & & \cdots \\ P^{h^b_{m_b0}} & P^{h^b_{m_b1}} & P^{h^b_{m_b2}} & \cdots & P^{h^b_{m_bn_b}} \end{bmatrix} = P^{H_b}$$

FIG. 10
-PRIOR ART- $$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

| 5 | 2 | 1 | 0 | 3 | 4 | → | 11 | 5 | 3 | 1 | 7 | 9 | 10 | 4 | 2 | 0 | 6 | 8 |

| 4 | 3 | 0 | 1 | 2 | 5 |

→

| 8 | 6 | 0 | 2 | 4 | 10 | 9 | 7 | 1 | 3 | 5 | 11 |

| 3 | 0 | 6 | 7 | 5 | 2 | 4 | 1 |

→

| 7 | 1 | 13 | 15 | 11 | 5 | 9 | 3 | 6 | 0 | 12 | 14 | 10 | 4 | 8 | 2 |

| 3 | 2 | 4 | 6 | 0 | 1 | 5 |

→

| 6 | 4 | 8 | 12 | 0 | 2 | 10 | 7 | 5 | 9 | 13 | 1 | 3 | 11 |

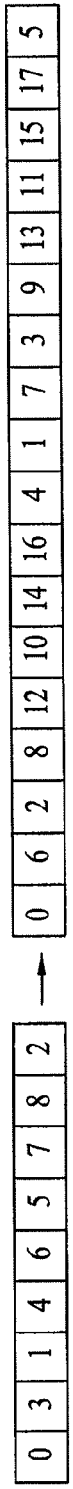

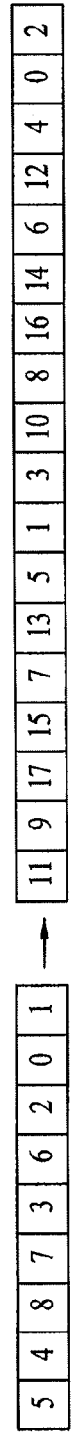

METHOD OF ENCODING DATA USING A LOW DENSITY PARITY CHECK CODE

This application is the National Phase of PCT/KR2008/001725 filed on Mar. 27, 2008, which claims priority under 35 U.S.C. 119(e) to U.S. Provisional Application Nos. 60/908,379, 60/910,190, 60/910,630 and 60/917,867 filed on Mar. 27, 2007, Apr. 4, 2007; Apr. 6, 2007 and May 14, 2007; respectively and under 35 U.S.C. 119(a) to Patent Application No. 10-2007-0063353 filed in Republic of Korea on Jun. 26, 2007, all of which are hereby expressly incorporated by reference into the present application.

TECHNICAL FIELD

The present invention relates to a method of low density parity check (LDPC) encoding, and more particularly, to a method of LDPC encoding using a parity check matrix.

BACKGROUND ART

FIG. 1 illustrates a structure of a mobile communication channel to which the present invention and the related art are applied. Hereinafter, the structure of the mobile communication channel will be described with reference to FIG. 1. A transmitter undergoes a channel coding procedure to transmit data without loss or distortion through a wireless channel. Examples of the channel coding include convolutional coding, turbo coding, LDPC coding, etc. The data which has undergone the channel coding procedure can be transmitted to the wireless channel as a single symbol which includes several bits. At this time, a procedure of mapping several bits to a single symbol is referred to as modulation.

The modulated data is converted into a signal for multiple transmission through a multiplexing procedure or a multiple access method. Examples of the multiplexing procedure include CDM, TDM, FDM, etc. The signal which has undergone the multiplexing block is changed to a structure suitable for transmission to one or more multi-antennas, and then is transferred to a receiver through the wireless channel. Fading and thermal noise occur in the transmitted data when the data passes through the wireless channel. For this reason, distortion may occur in the data.

The modulated data is transferred to the receiver through the wireless channel. In this case, fading and thermal noise occur in the transmitted data, whereby distortion may occur therein. The receiver performs a series of procedures of the transmitter in reverse order after receiving the distorted data. The receiver performs demodulation to convert the data mapped to the symbol into a bit stream, undergoes channel decoding, and recovers the distorted data to the original data.

An apparatus of performing the channel coding stores a matrix H or a generation matrix G, wherein the matrix H is a parity check matrix used to generate parity bits to be added to input data (information bits or systematic bits), and the generation matrix G is derived from the matrix H. In other words, the transmitter includes an encoder which generates parity bits through the input data and the matrix H or G. An apparatus of performing channel decoding checks whether the systematic bits are recovered well, through operation of the received data (distorted systematic bits+parity bits) with the matrix H, and performs operation again if the systematic bits are failed to be recovered.

Examples of the modulation include BPSK (Binary Phase Shift Keying), QPSK (Quadrature Phase Shift Keying), 16-QAM (Quadrature Amplitude Modulation), 64-QAM, 256-QAM, etc. For example, 16-QAM maps the data stream which has undergone channel encoding during modulation to a single symbol in a unit of 4 bits. 16-QAM de-maps the single symbol received through the wireless channel during demodulation to four bits.

Hereinafter, a data retransmission scheme that can be used along with the embodiments of the present invention will be described. There are provided various examples of the data retransmission scheme. Of them, HARQ (Hybrid Automatic Repeat reQuest) scheme will be described below. The HARQ scheme is obtained by combination of FEC (Forward Error Correction) symbol and ARQ (Automatic Repeat reQuest) which is a retransmission scheme in a mobile communication system. According to the ARQ scheme, if an error is detected from data received by the receiver, the receiver requests the transmitter to perform retransmission. Examples of the ARQ scheme include Stop-And-Wait, Selective Repeat, Go-Back-N, etc. depending on the retransmission method.

According to the Stop-And-Wait method, as shown in FIG. 2, if the transmitter receives an acknowledgement (ACK) message from the receiver after transmitting data, the transmitter transmits next data, wherein the ACK message notifies that the receiver has successfully received the data. If the transmitter receives a NACK message from the receiver, wherein the NACK message notifies that the receiver has failed to successfully receive the data, the transmitter retransmits the failed data.

Meanwhile, according to the Go-Back-N method, the transmitter first transmits N number of data and receives ACK messages from the receiver in due order. FIG. 3 illustrates a case of N=7, wherein the number N of data which are transmitted without ACK message is referred to as a window size. If the transmitter receives the NACK message in response to the $k^{th}$ data, the transmitter sequentially transmits data starting from the $k^{th}$ data.

FIG. 4 illustrates a Selective Repeat method. According to the Selective Repeat method, like the Go-Back-N method, the number N of data which are transmitted without ACK or NACK message is referred to as a window size, and retransmission is selectively performed for only data with NACK message.

According to the aforementioned HARQ method, if retransmission is performed in the ARQ method, previously transmitted data is combined with retransmitted data to restore the data through FEC symbol. The HARQ method is classified into a chase combining method and an incremental redundancy method depending on a combining method of the two data. According to the chase combining method, as shown in FIG. 5, the receiver combines transmission data with retransmission data to increase a receiving signal to noise ratio (SNR), thereby increasing a receiving success ratio of data at the receiver.

Meanwhile, unlike the chase combining method, the incremental redundancy method (hereinafter, referred to as 'IR method') transmits some of encoded data, which have not been used for first transmission, during retransmission of the transmitter to decrease a coding rate of data received at the receiver, thereby increasing a receiving success ratio.

Hereinafter, LDPC coding will be described. A concept of LDPC coding is as follows.

A linear code can be described with the generation matrix G or the parity check matrix H. A characteristic of the linear code is that the equation of $Hc^T=0$ is satisfied for every bit of a codeword 'c'. As one of the linear code, the LDPC code which is recently paid attention to was proposed by Gallager in 1962 for the first time. One of the characteristics of the LDPC coding is that most of elements of the parity check matrix H are '0' and the number of elements which are not '0'

' is small compared to the codeword, so that repetitive decoding based on probability is possible. A parity check matrix H for the first proposed LDPC code was defined in a non-systematic form and each row and column of the parity check matrix were designed to equally have a small weight.

In this case, the weight means the number of '1' included in each row and column.

The LDPC coding scheme has low decoding complexity since a density of elements which are not '0' on the parity check matrix H is low. Further, decoding performance of the LDPC coding is superior to other coding schemes, which is adjacent to the theoretical limit of Shannon. However, the LDPC coding scheme could not be implemented with the hardware technique at the time of proposal by Gallager, so that the LDPC coding scheme has not been paid attention to by the people for 30 years. A repetitive decoding scheme using graphs was developed in early 1980's and a couple of decoding algorithms for the LDPC code have been developed using the repetitive decoding scheme. One of them is a sum-product algorithm.

Hereinafter, features of the LDPC coding will be described. The LDPC coding has a superior error correction capability, thereby improving communication speed and capacity. When combined with a multi-input and multi-output (MIMO) scheme, the LDPC coding can be applied to a high speed wireless LAN having a data transmission speed of several hundred Mbit/s, a high speed mobile communication system having a data transmission speed of one Mbit/s or greater for a user moving at a speed of 250 km/h, and an optical communication system having a data transmission speed of 40 Gbit/s or greater. In addition, the LDPC coding can enable quantum encryption communication diminishing the number of retransmission times on a communication path having low quality since transmission quality is improved due to its high error correction capability. Further, data packets having errors can be easily recovered due to the low complexity and superior loss compensation capability of the LDPC coding, so that contents having quality equal to that of TV can be transmitted through the Internet and the mobile communication system. 10G BASE-T transmission within a range of 100 m which has been considered impossible earlier can be realized owing to wide application range and large capacity which are advantages of the LDPC coding. In addition, transmission capacity of a single satellite transmitter having 36 MHz bandwidth can be increased up to 80 Mbit/s which is 1.3 times of usual transmission capacity.

According to a general LDPC encoding method, information bits are encoded by using a generation matrix G derived from an LDPC parity check matrix H. In order to derive the generation matrix G, the parity check matrix H is configured in the form of $[P^T: I]$ by using a Gaussian reduction method. Assuming the number of the information bits is 'k' and a size of an encoded codeword is 'n', the 'P' is a matrix having 'k' number of rows and '(n−k)' number of columns and the 'I' is an identity matrix having 'k' number of rows and columns.

When the parity check matrix H is represented in the form of $[P^T: I]$, the generation matrix G has the form of $[I: P]$. The information bits of k bits to be encoded can be represented as a matrix 'x' having one row and 'k' number of columns. In this case, the codeword 'c' is represented in the form of the following equation.

$$c = xG = [x:xP] \quad \text{[Equation 1]}$$

In the above equation, x represents an information part (or a systematic part), and xP represents a parity part.

An LDPC decoding method according to the related art will be described. A matrix $H_{sys}$ is derived from a LDPC parity check matrix H, and a matrix $G_{sys}$ is derived from the matrix $H_{sys}$, whereby encoding is performed. In this case, the matrix $H_{sys}$ is obtained by configuring one part of the parity check matrix H in a systematic type through row operation. The matrixes $H_{sys}$ and $G_{sys}$ can be expressed by the following equations 2 and 3.

$$H_{sys} = [P: I_{n-k}] \quad \text{[Equation 2]}$$

$$G_{sys} = [I_k: -P^T] \quad \text{[Equation 3]}$$

Data encoded in a communication system includes noise when passing through a wireless channel of FIG. 1. A receiver represents a decoding procedure of data through a procedure as shown in FIG. 8. A decoding block of the receiver obtains an information bit 'x' from a receiving signal c' having the encoded codeword 'c' added with noise by using the feature of $cH^T = 0$. In other words, assuming that the received codeword is c', a value of $c'H^T$ is calculated. As a result, if the value of $c'H^T$ is 0, first k number of bits from c' are determined as the information bit x. If the value of $c'H^T$ is not 0, c' which satisfies $c'H^T$ of 0 is searched by using a decoding method such as a sum-product algorithm through a graph, thereby restoring the information bit x.

Hereinafter, a coding rate of LDPC coding will be described.

Generally, when the size of the information bit is k and the size of the codeword which is actually transmitted is n, a coding rate (R) is as follows.

$$R = k/n \quad \text{[Equation 4]}$$

When the matrix H necessary for LDPC encoding and decoding has a row size of m and a column size of n, a coding rate is as follows.

$$R = 1 - m/n \quad \text{[Equation 5]}$$

As described above, since the related art LDPC code is encoded and decoded by the matrix H, the structure of the matrix H is very important. In other words, since encoding and decoding performance is greatly affected by the structure of the matrix H, design of the matrix H is more important than anything else.

In the LDPC decoding method according to the related art, complex matrix operation is required when the matrixes $H_{sys}$ and $G_{sys}$ are generated from the parity check matrix. Particularly, a problem occurs in that resources required for the operation also increase as the size of the parity check matrix increases, whereby complexity of the overall system is increased.

DISCLOSURE OF THE INVENTION

Accordingly, the present invention is suggested to substantially obviate one or more problems due to limitations and disadvantages of the related art. An object of the present invention is to provide a method of LDPC encoding, which can reduce complexity and improve efficiency.

Another object of the present invention is to provide a method of LDPC encoding, which can more simply support a retransmission function such as ARQ or HARQ.

To achieve these objects and other advantages and in accordance with the purpose of the invention, as embodied and broadly described herein, a method for encoding data using a parity check matrix comprises generating a fourth base matrix by applying a row permutation pattern and a column permutation pattern to rows and columns of a third base matrix, respectively, the third base matrix including a plurality of indexes, each of the plurality of indexes indicating a sub-matrix; generating the parity check matrix by replacing each index of the fourth base matrix with a corresponding sub-matrix; outputting an encoded bit stream by encoding an input bit stream using the generated parity check matrix; and permuting an order of sequences of the encoded bit stream according to an inverse of the column permutation pattern.

BRIEF DESCRIPTION OF THE DRAWINGS

FIG. 9 is a diagram illustrating an example of a base matrix suggested in the related art.

FIG. 10 is a diagram illustrating a method of expressing a matrix depending on indexes, i.e., shift numbers.

Figure 14A:
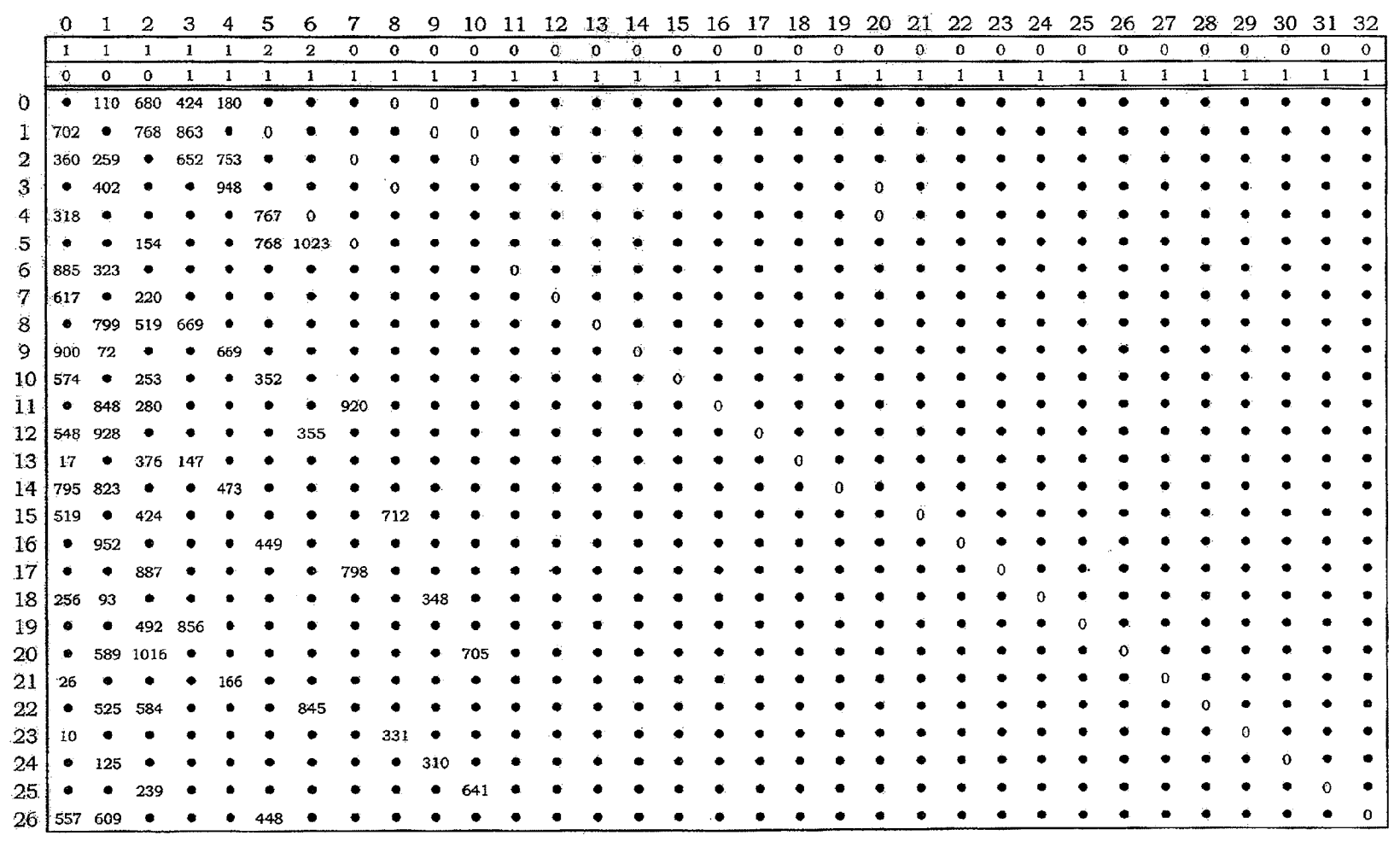
Figure 14B:
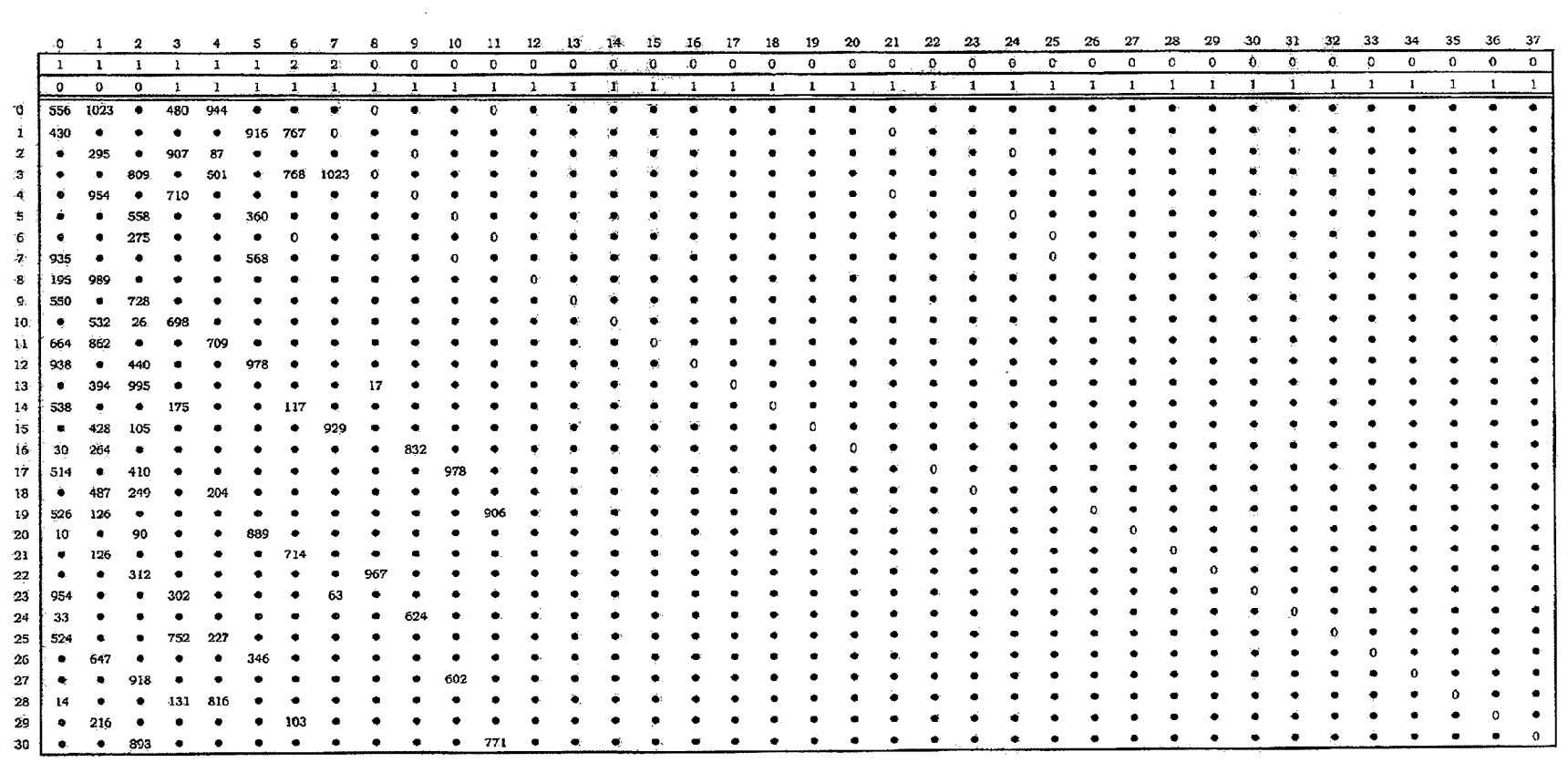
Figure 14C:
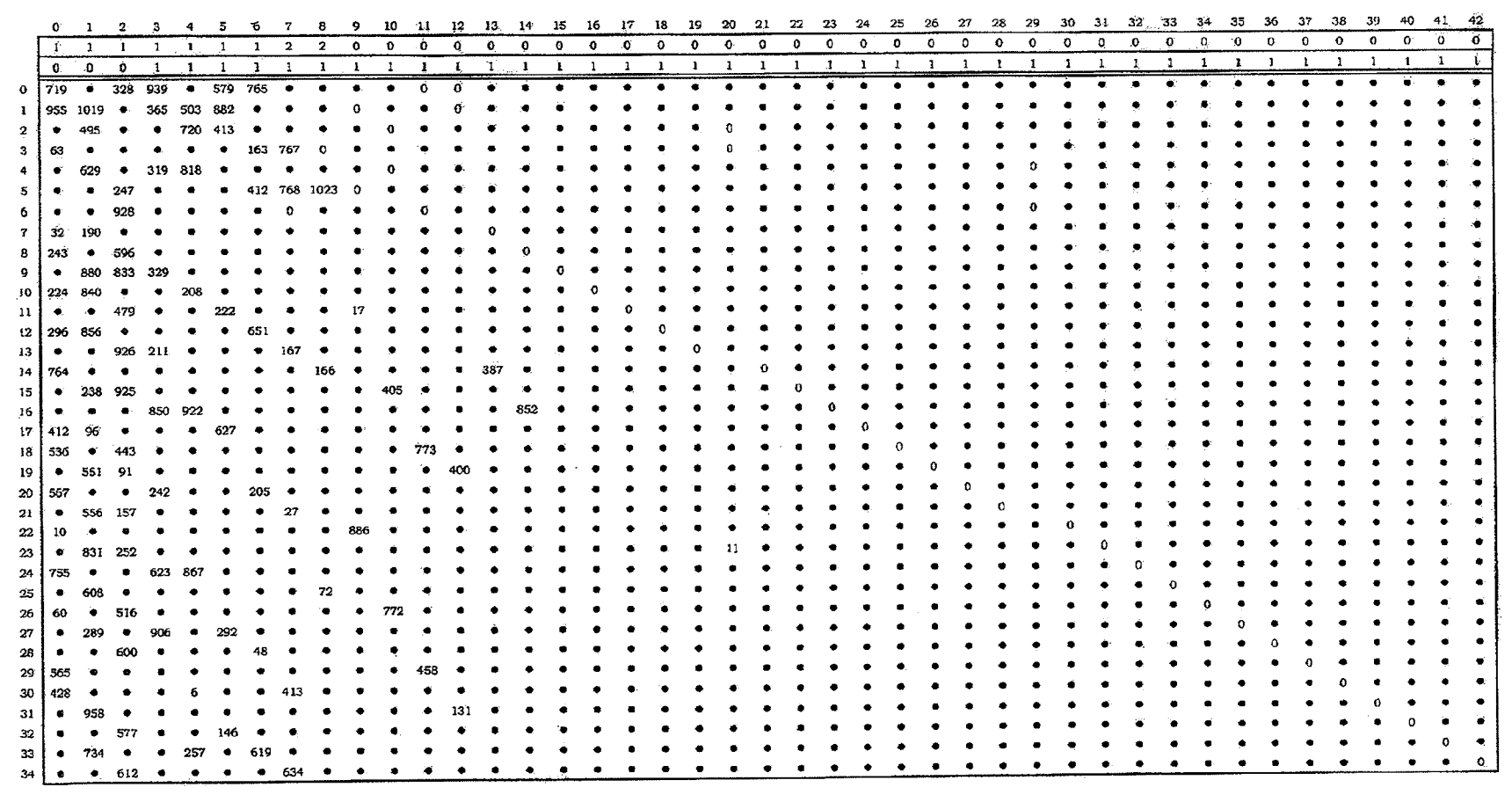
Figure 14D:
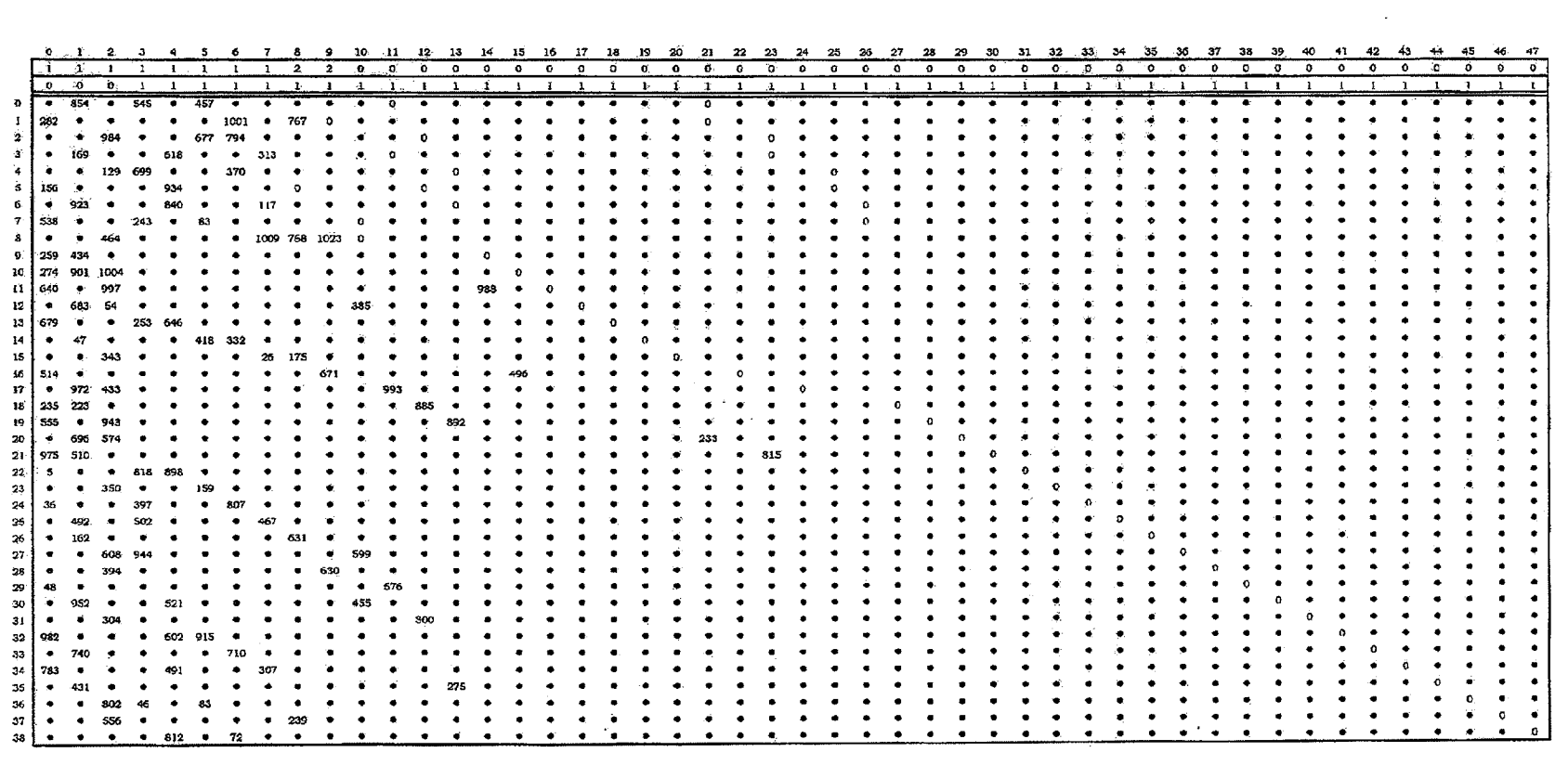

FIG. 14A to FIG. 14F are diagrams illustrating examples of base matrixes according to the embodiment of the present invention;

FIG. 16A to FIG. 16C are diagrams illustrating examples of row/column permutation methods according to one embodiment of the present invention; and FIG. 17A to FIG. 27C are diagrams illustrating examples of row/column permutation methods according to another embodiment of the present invention.

BEST MODE FOR CARRYING OUT THE INVENTION

Hereinafter, structures, operations, and advantages of the present invention will be understood readily by the preferred embodiments of the present invention, examples of which are illustrated in the accompanying drawings.

Since the embodiments of the present invention are based on a method of encoding and decoding using a structured LDPC, a method of encoding and decoding using a structured LDPC will be described hereinafter.

A parity check matrix is used to encode data using an LDPC code. As described above, the parity check matrix is a binary matrix and includes elements, most of which are '0' and some of which are '1.' Since the parity check matrix actually used for encoding or decoding has a size of $10^5$ bits or greater, a large-scaled memory is required to store the parity check matrix.

Figure 1:
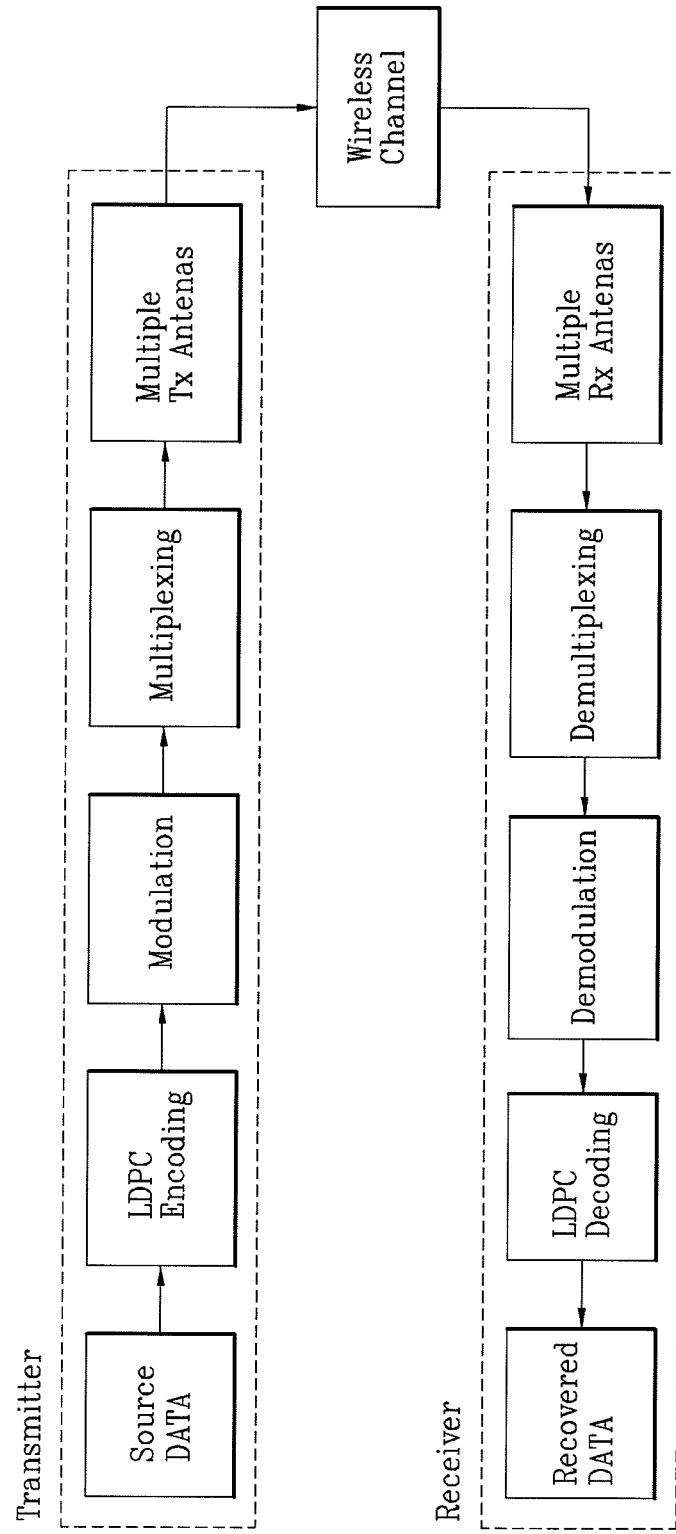
FIG. 1 is a diagram illustrating a structure of a mobile communication channel to which the present invention and the related art are applied.
Figure 2:
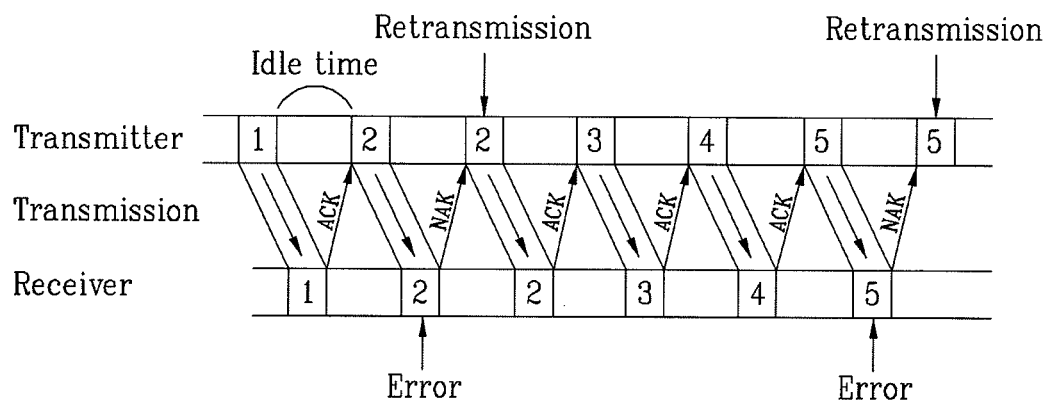
FIG. 2 to FIG. 4 are diagrams illustrating retransmission schemes according to the related art.
Figure 3:
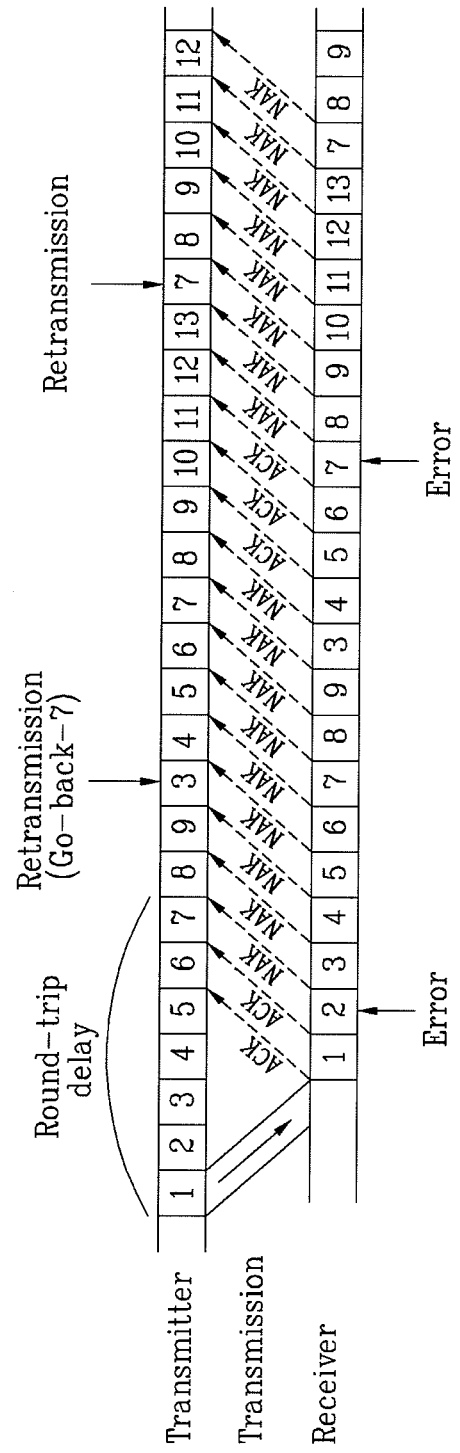
Figure 4:
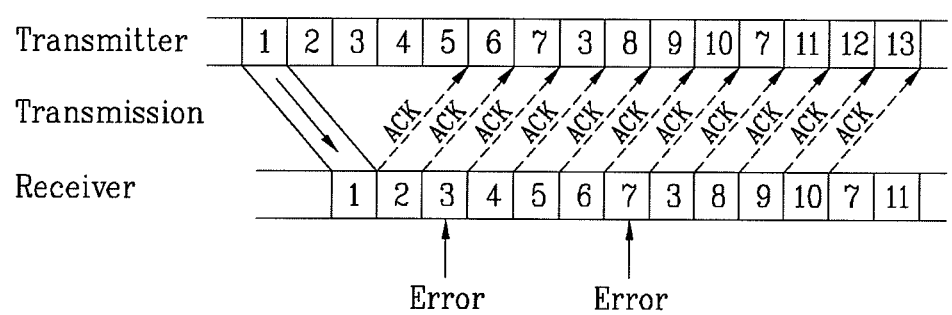
Figure 5:
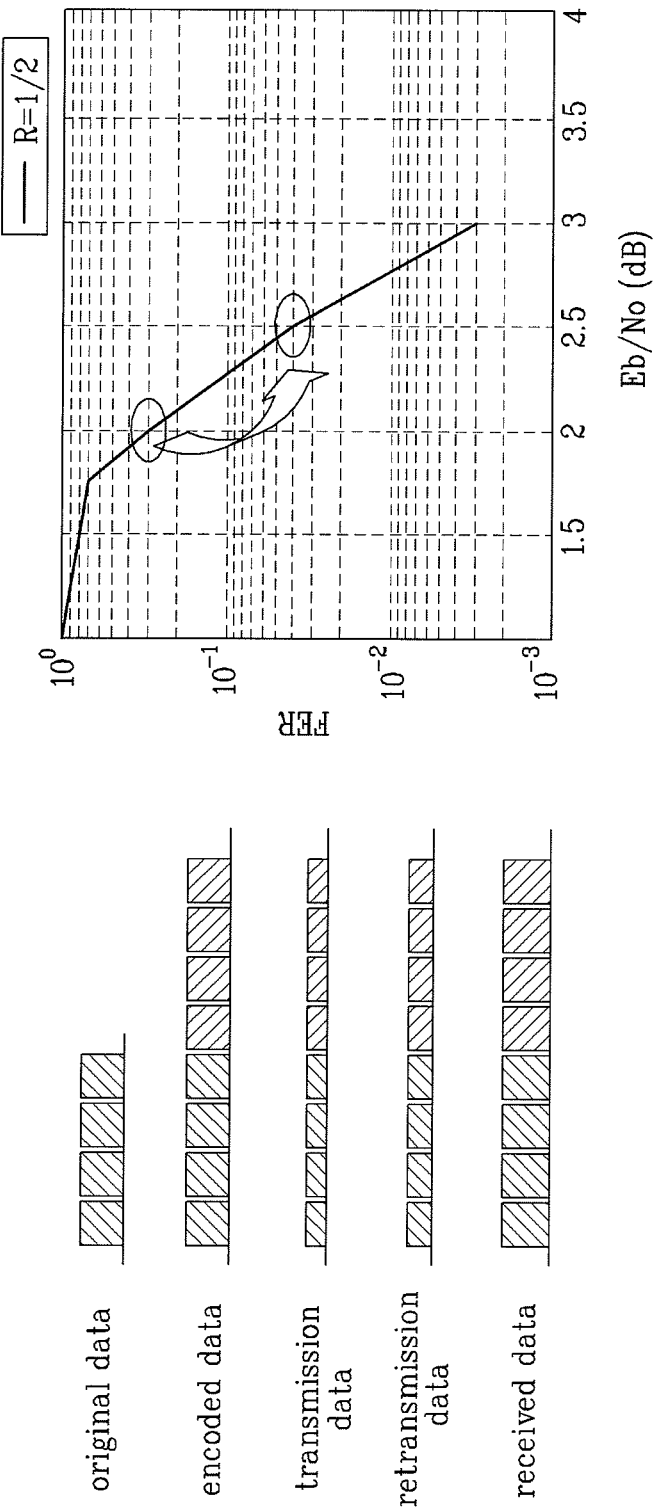
FIG. 5 and FIG. 6 are diagrams illustrating retransmission schemes according to the related art and the present invention.
Figure 6:
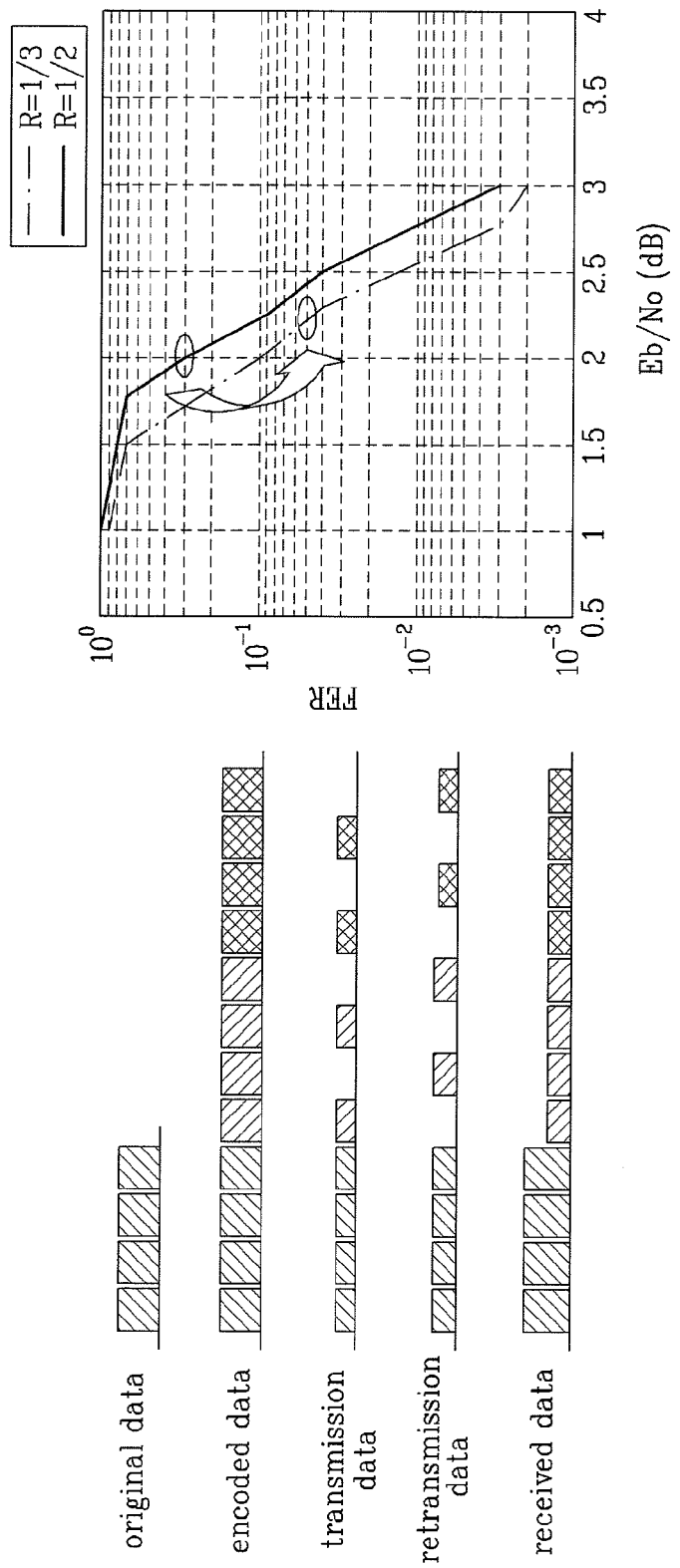
Figures 7, 8:
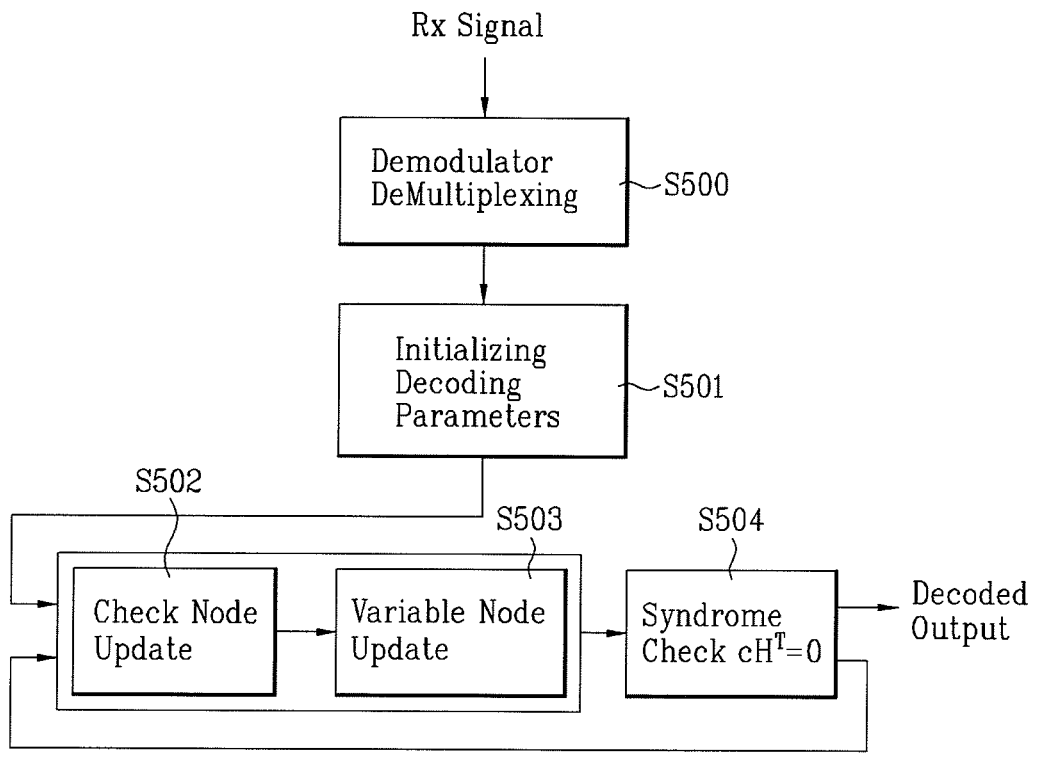
FIG. 7 is a diagram illustrating a concept of a sub-block on a parity check matrix.
FIG. 8 is a diagram illustrating a method of LDPC decoding according to the related art and the present invention.

In a method of encoding using a structured LDPC, a parity check matrix is stored in a type of a base matrix. The base matrix includes a plurality of indexes, each of which indicates a sub-matrix. As shown in an exemplary parity check matrix (H) of FIG. 7, elements of matrix H may be expressed as sub-matrices ($p^{h_{00}^b}$, $p^{h_{01}^b}$, ..., $p^{h_{mbnb}^b}$,). In other words, each sub-matrix is a matrix of a constant size (L×L) and is expressed by a specific index. Each index of the base matrix is replaced with a sub-matrix indicated by the corresponding index when encoding or decoding is performed, whereby the base matrix is used by being expanded to the parity check matrix. The term of "base matrix" can be replaced with a "model matrix" or a "base parity check matrix."

Figures 9, 10:
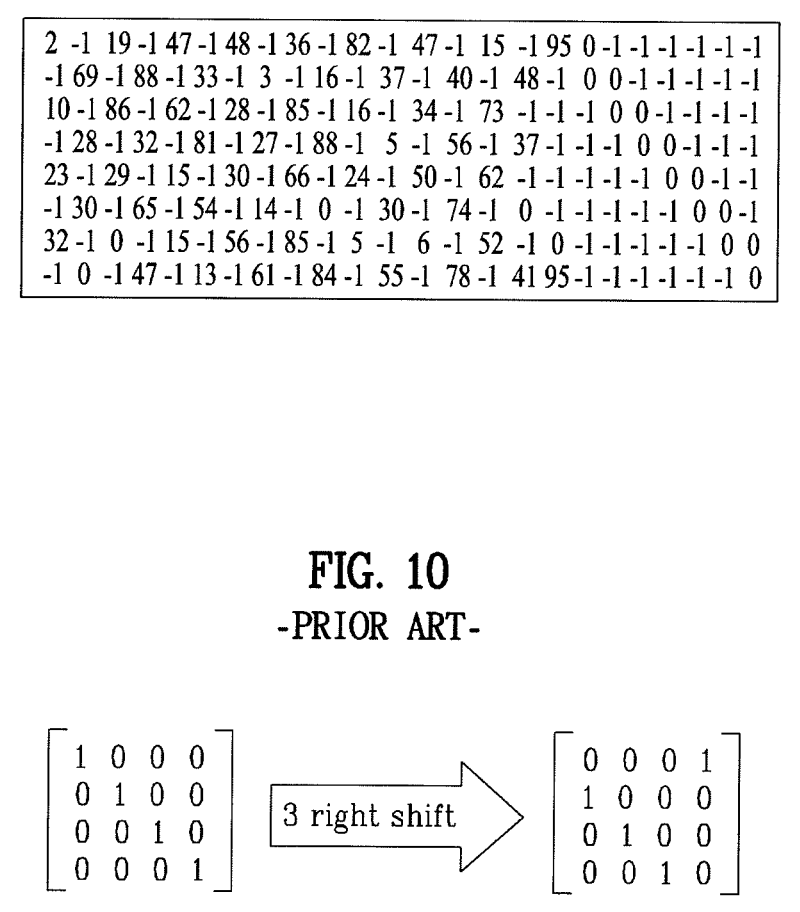

FIG. 9 illustrates an example of the base matrix. In FIG. 9, each integer means an index of a corresponding sub-matrix. For example, if the index is equal to '−1,' a sub-matrix having the index of '−1' means a zero matrix having a specific size. If the index is equal to '0,' a sub-matrix having the index of '0' means an identity matrix having the specific size. Also, indexes excluding '−1' and '0,' which are positive integers, can represent a predetermined rule which generates a corresponding sub-matrix. For example, indexes which are positive integers represent shift values. In other words, supposing that each sub-matrix is a permutation matrix generated by shifting each row or column of the identity matrix in a constant direction, the shift value could be an index of the corresponding sub-matrix. For example, if a sub-matrix is expressed by an index of 1,' the corresponding sub-matrix is generated by shifting each row or column of the identity matrix by one space (row or column) in a specific direction. No index may be used in the base matrix, so as to express a sub-matrix which is a zero matrix. Namely, a sub-matrix which is a zero matrix may be expressed as "NULL" in the base matrix without index. Alternatively, the zero matrix may be expressed as "•" in the base matrix.

FIG. 10 illustrates a method of expressing a matrix according to the aforementioned indexes, i.e., shift values. When a specific parity check matrix is structured as a matrix (i.e., sub-matrix) of 4×4 size, a sub-matrix having an index of '3' becomes a permutation matrix generated by shifting each column of the identity matrix of 4×4 size to the right by three columns.

Memory capacity for storing the parity check matrix can be saved in such a manner that a base matrix obtained by expressing each sub-matrix by one index is stored in accordance with a structured LDPC scheme and a base matrix stored during encoding or decoding is expanded to its original parity check matrix.

Figure 11:
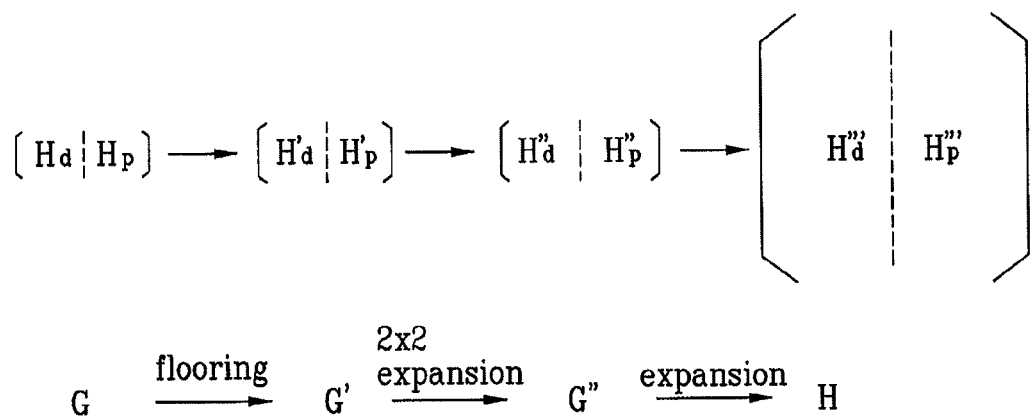
FIG. 11 is a diagram illustrating an embodiment according to the present invention.

FIG. 11 illustrates one embodiment according to the present invention. The embodiment of FIG. 11 relates to an example of generating a parity check matrix (H) through a flooring operation procedure and expansion procedures of two times based on a first model matrix (G). In FIG. 11, although 'G' has been used as a symbol for expressing the first base matrix, it is to be understood that this 'G' is different from 'G' which means a generation matrix.

Referring to FIG. 11, flooring operation is performed for the first base matrix (G) to generate a second base matrix (G'). The flooring operation means an operation scheme for generating a second base matrix for a second sub-matrix of actual lifting order (for example, 5×5) from a first base matrix for a first sub-matrix of maximal lifting order (for example, 12×12), and can be expressed by the following equation 6.

$$\text{Shift}(L) = \text{floor}(\text{shift}(L_{max})L/L_{max}) \quad \text{[Equation 6]}$$

In the above equation, shift(L) means the number of shift intervals of the second sub-matrix, and floor(x) means an integer most approximate from x to a minus infinity direction.

In other words, if each element of the first base matrix is configured by an index (for example, if each row or column of a base permutation matrix is shifted in a given direction, the index means a shift number) indicating the first sub-matrix of $L_{max} \times L_{max}$ dimension (or size), it is necessary to generate a second base matrix of which elements are configured by indexes indicating a second sub-matrix of L×L dimension. At this time, each element of the first base matrix can be replaced with each element of the second base matrix using the Equation 6.

For example, a second sub-matrix, which is formed by mapping a first sub-matrix for an identity matrix of 5×5 dimension, can be obtained as illustrated in the following way in accordance with the equation 6. In this case, the first sub-matrix is formed by shifting each row of an identity matrix of 12×12 dimension by '7' in a specific direction.

shift(5)=floor(shift(12)×5÷12)=floor(7×5÷12)=floor (2.92)=2

In other words, the first sub-matrix, which is formed by shifting each row of an identity matrix of 12×12 dimension by '7' in a specific direction, is mapped with the second matrix which is formed by shifting each row of an identity matrix of 5×5 dimension by '2' in a specific direction.

In this way, element values of the first base matrix can be replaced with element values of the second base matrix to generate the second base matrix. In this case, the second base matrix has the same size as that of the first base matrix. Also, the location of "NULL" in the first base matrix, i.e., index indicating a zero matrix becomes "NULL" even in the second base matrix. When this is implemented in hardware or software, the 'floor' operation can make complexity very simple. Alternatively, a modulo operation may be performed when the second base matrix is generated from the first base matrix.

Figure 12:
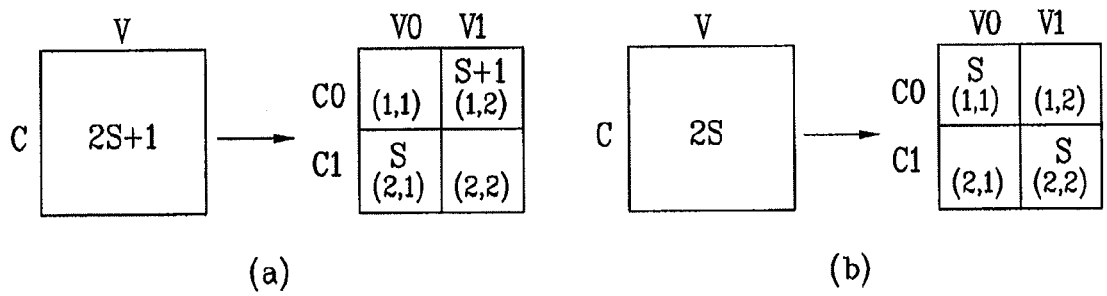
FIG. 12 is a diagram illustrating an example of a 2×2 expansion method.

In FIG. 11, the 2×2 expansion procedure means that a third base matrix (G") is generated by expanding each element (index) of the second base matrix (G') to a 2×2 matrix. FIG. 12(a) illustrates an example of a 2×2 expansion method when a specific index of the second base matrix is an odd number, and FIG. 12(b) illustrates a 2×2 expansion method when a specific index of the second base matrix is an even number. Each sub-matrix of the second base matrix (G') is expanded to four sub-matrixes in the third base matrix (G") by the 2×2 expansion procedure. In this case, since each sub-matrix of the third base matrix (G") has a size of ½ of each sub-matrix of the second base matrix (G'), the whole size of the second base matrix (G') becomes the same as that of the third base matrix (G"). For example, in FIG. 12, a sub-matrix having a size of 1024 is expanded to four sub-matrixes each having a size of 512.

Hereinafter, the first to third base matrixes will be compared with one another in view of size. It is supposed that that the number of columns in the first base matrix is $n_B$, the number of rows in the first base matrix is $(n_B-k_B)$, and each sub-matrix has a $L_{max} \times L_{max}$ dimension. In this case, the number of columns in the second base matrix and the number of rows in the second base matrix are the same as those in the first base matrix, and each sub-matrix included in the second base matrix has an L×L dimension. Also, the number of columns in the third base matrix becomes $n_B \times 2$, the number of rows in the second base matrix is $(n_B-k_B) \times 2$, and each sub-matrix included in the third base matrix has an L/2×L/2 dimension.

In this specification, "index matrix" means a matrix generated as one index is expanded by the 2×2 expansion method. As shown in FIG. 12, the index matrix can include two indexes and two "NULL" elements.

As shown in FIG. 12(a), when a specific element of the second base matrix, i.e., a specific index is an odd number (2S+1, S is an integer larger than 0), a corresponding sub-matrix is expanded to a cross diagonal structure type of 2×2 dimension. In other words, each sub-matrix of the second base matrix is expanded to four sub-matrixes. At this time, among the four sub-matrixes, the sub-matrixes in (1, 1) and (2, 2) locations are zero matrixes, index of the sub-matrix in (1, 2) location is (S+1), and index of the sub-matrix in (2, 1) location is S.

In FIG. 12(b), when a specific element of the second model matrix, i.e., a specific index is an even number (2S, S is an integer larger than 0), a corresponding sub-matrix is expanded to a diagonal structure type of 2×2 dimension. In other words, as shown in FIG. 12(b), indexes of the sub-matrixes in (1, 1) and (2, 2) locations are S, and the sub-matrixes in (1, 2) and (2, 1) locations are zero matrixes. When an index of a sub-matrix in the second model matrix is equal to '0,' it means that the corresponding sub-matrix is an identity matrix. In this case, the index is expanded in accordance with the example of FIG. 12(b). When a specific sub-matrix of the second model matrix is a zero matrix, the corresponding sub-matrix is expanded to four zero matrixes of ½ size by the 2×2 expansion procedure. The sub-matrix which is a zero matrix included in the first model matrix and the second model matrix can be expressed as "NULL." In this case, an element (NULL) of which index is not expressed in the first model matrix or the second model matrix indicates a zero matrix.

A permutation procedure means that permutation is applied to either at least one of rows and columns of the third base matrix (G") in accordance with a row permutation pattern or a column permutation pattern, so as to generate a fourth base matrix (G'''). A permutation method of rows and columns will be described later.

Each element of the fourth base matrix is configured by index indicating a specific sub-matrix. In this case, each index is replaced with a corresponding sub-matrix to generate a final parity check matrix (H) and input data streams can be encoded by using the generated parity check matrix.

When input data streams are encoded by an encoder, all the procedures of FIG. 11 may not be performed. For example, the flooring operation procedure, the 2×2 expansion procedure, and the permutation procedure of columns/rows may be omitted if the final parity check matrix is stored. For another example, at least one of the flooring operation procedure and the 2×2 expansion procedure may be omitted.

Figure 13:
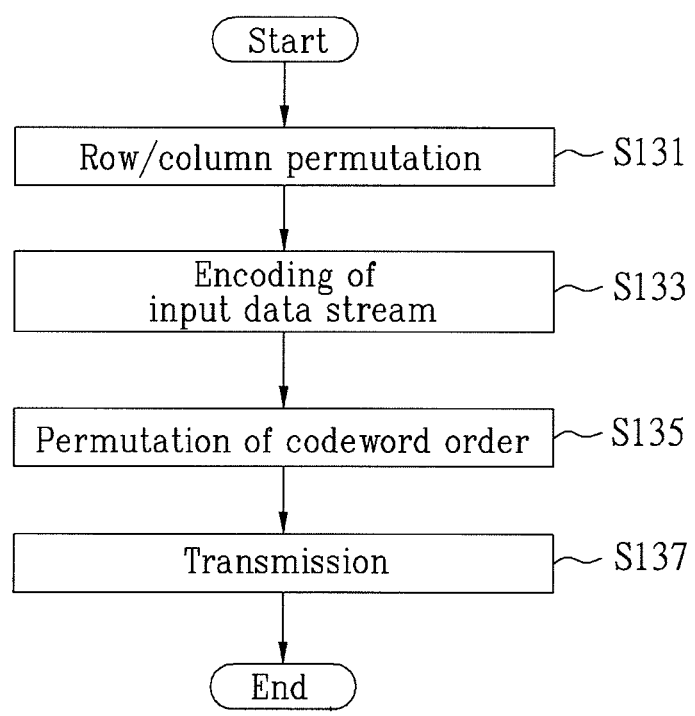
FIG. 13 is a flow chart illustrating a procedure of an embodiment according to the present invention.
Figure 14E:
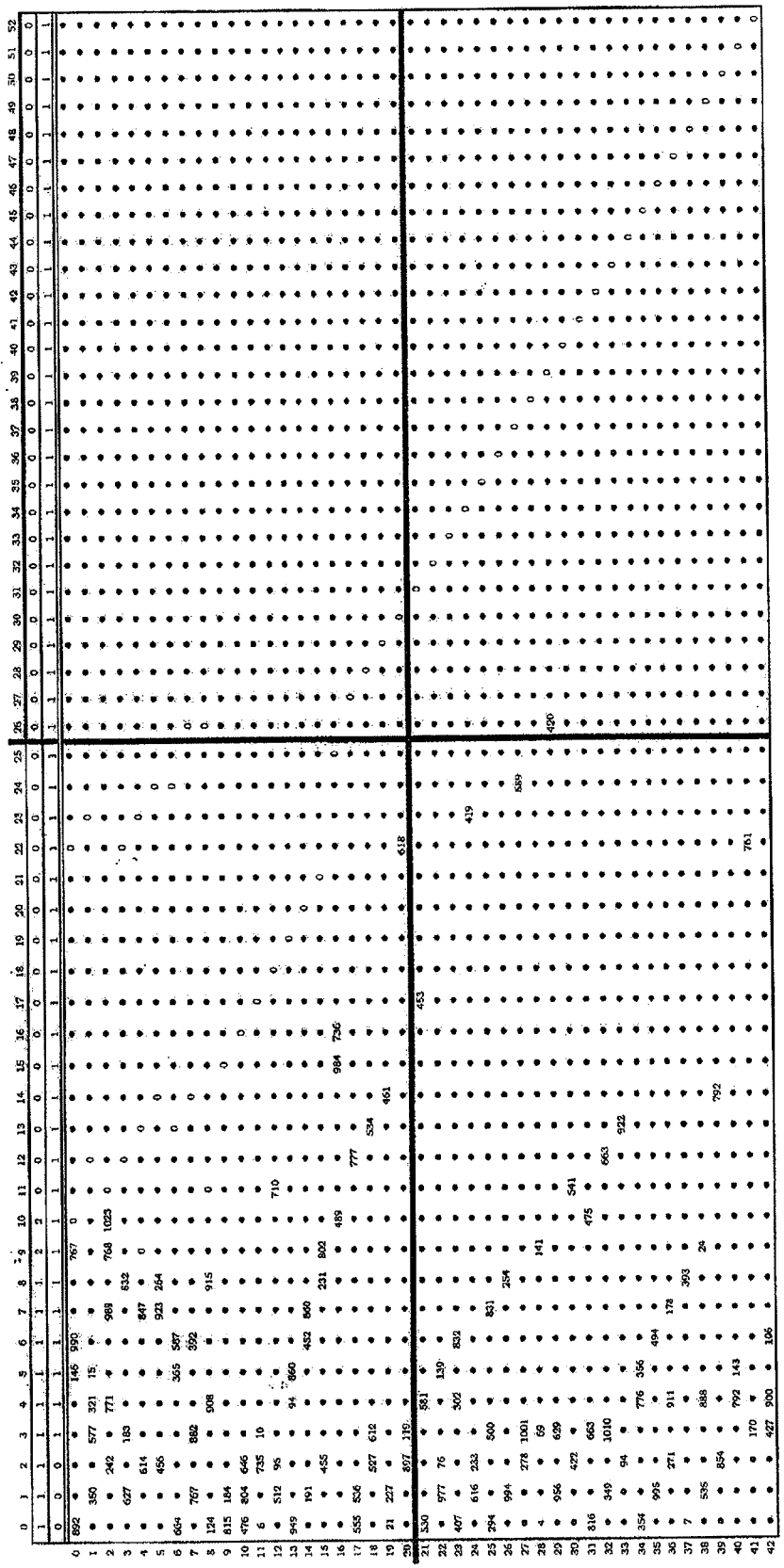
Figure 14F:
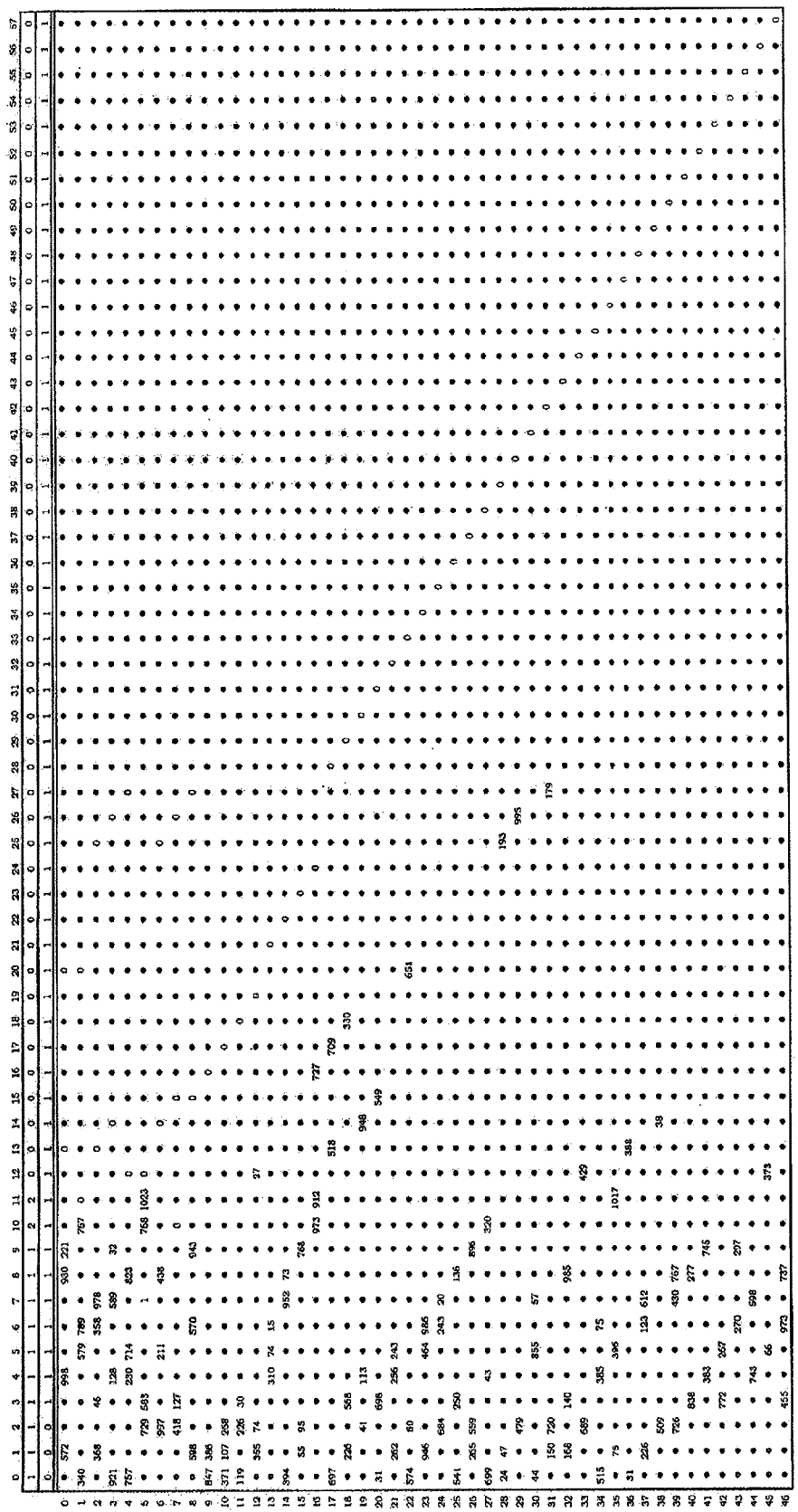

FIG. 13 is a flow chart illustrating one embodiment according to the present invention.

Referring to FIG. 13, permutation is applied to rows, columns, or rows and columns of the parity check matrix, so as to generate a final parity check matrix for encoding or decoding of input data streams (S131).

In general, the parity check matrix H can be expressed as $H=[H_d|H_p]$ ($H_d$ is (n−k)×k dimension, and $H_p$ is (n−k)×(n−k) dimension). $H_d$ is an information part, and $H_p$ is a parity part. Also, k means a length (bit unit) of input data streams, and n means a length (bit unit) of encoded codeword (c).

Preferably, the parity part $H_p$ has a substantial dual diagonal structure. The dual diagonal structure means a matrix of which main diagonal elements and diagonal elements under or above the main diagonal elements are all '1' and the other elements are '0' regardless of its dimension. The substantial dual diagonal structure means that, although not the perfect dual diagonal structure, the parity part $H_p$ has a structure almost similar to the dual diagonal structure. Accordingly, it is preferable that permutation is applied to rows and/or columns in the permutation procedure (S131) in order that the parity part $H_p$ of the parity check matrix has the substantial dual diagonal structure.

Meanwhile, although the permutation procedure (S131) has been performed for the third base matrix in FIG. 11 to generate the fourth base matrix, it may be performed for the first or second base matrix. In other words, in FIG. 11, the permutation procedure of rows/columns is performed for any one or two or more of the first base matrix (G), the second base matrix (G') and the third base matrix (G"), so that the parity part of the fourth base matrix finally has a dual diagonal structure. Moreover, it is preferable that the first column of the parity part of the fourth base matrix has a weight of 3 through the permutation procedure (S131) of rows and/or columns.

According to one embodiment of the present invention, in order to generate the fourth base matrix (G''') from the third base matrix (G"), a row permutation pattern for permutation of rows and a column permutation pattern for permutation of columns are previously determined, and the row permutation pattern and the column permutation pattern are applied to the third base matrix (G"), whereby the fourth base matrix (G''') can easily be generated.

If the final parity check matrix H is generated by replacing each index of the fourth base matrix (G''') with a corresponding sub-matrix, input data streams are encoded (S133).

As described above, in the method of encoding using LDPC code, input source data can be encoded using a generator matrix. In other words, input source data $s_{1 \times k}$ of k bit are encoded in the generator matrix to obtain a codeword $x_{1 \times k}$ of n bit. The codeword x has a configuration of x=[s p]=[$s_0$, $s_1$, ..., $s_{k-1}$, $p_0$, $p_1$, ..., $p_{m-1}$], wherein ($p_0$, $p_1$, ..., $p_{m-1}$) are parity check bits, and ($s_0$, $S_1$, ..., $s_{k-1}$) are systematic bits.

However, the encoding method using the generator matrix is very complicate. Accordingly, in order to reduce such complexity, it is preferable to directly encode input source data by using the parity check matrix H without through the generator matrix G. In other words, since x=[s p], H·x=H·[s p]=0 is obtained using a feature of H·x=0. Since the parity check bit 'p' can be obtained from the equation H·x=H·[s p]=0, the codeword x=[s p] can be obtained.

Next, de-permutation is applied to the order of symbols constituting the codeword encoded by the parity check matrix (S135). At this time, de-permutation is performed in such a manner that the order of symbols constituting the codeword corresponds to the order of columns of the final parity check matrix corresponding to the case where permutation is not applied to the columns in the row/column permutation procedure (S131). In other words, if de-permutation is applied to the symbols of the codeword, the order of the symbols becomes an inverse order of the permutation order of columns configured in the row/column permutation procedure (S131).

In the LDPC encoding method, if encoding is performed for 'k' number of input data streams by the parity check matrix of (n−k)×n, the codeword configured by 'n' number of symbols is output. In other words, the 'n' number of symbols constituting the codeword is the same as the number of columns of the parity check matrix, and the order of the symbols constituting the codeword corresponds to the order of columns of the parity check matrix.

In the embodiments according to the present invention, if permutation is applied to columns to obtain a predetermined part (for example, parity part) of the parity check matrix having a structured format, permutation is also applied to the order of the symbols of the encoded codeword. Accordingly, it is necessary that permutation is applied to the order of the codeword symbols so as to correspond to the columns of the parity check matrix before permutation. It is possible to efficiently support a retransmission scheme such as ARQ or HARQ through permutation of the order of the codeword.

If encoding using the parity check matrix is performed by the transmitter, the transmitter transmits the codeword, to which permutation has been applied, to the receiver (S137). A data processing procedure required in a communication system, such as rate matching, interleaving, and modulation, can be performed during the transmission procedure of the codeword.

When the receiver receives the codeword from the transmitter and decodes the received codeword, the receiver generates the parity check matrix in accordance with the method of generating a parity check matrix according to the embodiment of the present invention and decodes the received codeword by using the generated parity check matrix.

FIG. 14A to FIG. 14F illustrate examples of base matrixes (first base matrix G in FIG. 11) according to the embodiments of the present invention, i.e., examples of the cases where the number $k_B$ of information blocks is 6 to 11. In FIG. 14A to FIG. 14F, '0' means an identity matrix, "•" means a zero matrix, and a random positive integer means a sub-matrix obtained by shifting each row of the identity matrix by the corresponding positive integer. Each base matrix has related parameter values $k_B$, $n_B$, $s_B$, and $L_{max}$, wherein $k_B$ and $n_B$ are values related to the size of the corresponding base matrix and $L_{max}$ means a maximum lifting order of each sub-matrix included in the corresponding base matrix. The number of columns and the number of rows of each base matrix are $n_B$ and $n_B-k_B$, respectively. Also, $s_B$ means the number of state columns of each base matrix, wherein the "state columns" mean elements of the codeword which is not transmitted to the receiver. In each base matrix illustrated in FIG. 14A to FIG. 14F, $s_B$ is 3 and $L_{max}$ is 1024.

Table 1 illustrates permutation patterns for making the parity part having a dual diagonal structure through permutation of rows and columns of the base matrixes illustrated in FIG. 14A to FIG. 14F. In Table 1, T means index of the base matrix, $K_i$ means the number of multiplexing chains, $Q_i$ means a row permutation pattern for permutation of rows, and $P_i$ means a column permutation pattern for permutation of columns. In Table 1, rows are permuted by the number of multiplexing chains.

The fourth base matrix (G''') can be generated in such a manner that permutation is applied to the order of rows of the third base matrix (G") like the order represented by $Q_i$ and permutation is applied to the order of columns of the third base matrix (G") like the order represented by $P_i$, with respect to the base matrix corresponding to the number of information blocks. The row permutation pattern $Q_i$ and the column permutation pattern $P_i$ are applied in such a manner that row index $k_r$ and column index $k_c$ in the fourth base matrix (G''') are the same as row index $Q_i(k_r)$ and column index $P_i(k_c)$ in the third base matrix (G").

Meanwhile, if permutation is applied to the order of symbols of the encoded codeword (S135), de-permutation is applied to the order of symbols of the codeword by using the column permutation pattern ($P_i$) to correspond to the order of columns of the parity check matrix before permutation is applied to the rows and columns. In other words, permutation is applied to the order of symbols of the encoded codeword in accordance with an inverse order of the column permutation pattern ($P_i$).

TABLE 1

| i | $K_i$ $Q_i$ | $P_i$ |
|---|---|---|
| 0 | 12  11 5 3 1 7 9<br>10 4 2 0 6 8 | 0 1 2 3 4 5 6 7 8 9 10 12 11 15 21 19 17 41 13 14 20 18 16<br>40 22 23 24 25 26 27 28 29 30 31 32 33 34 35 36 37 38 39<br>42 43 44 45 46 47 48 49 50 51 52 53 54 55 56 57 58 59 60<br>61 62 63 64 65 |
| 1 | 16  7 1 13 15 11<br>5 9 3 6 0<br>12 14 10 4 8 2 | 0 1 2 3 4 5 6 7 8 9 10 11 12 14 13 17 23 51 21 49 19 43 15<br>16 22 50 20 48 18 42 24 25 26 27 28 29 30 31 32 33 34 35<br>36 37 38 39 40 41 44 45 46 47 52 53 54 55 56 57 58 59 60<br>61 62 63 64 65 66 67 68 69 70 71 72 73 74 75 |
| 2 | 14  11 3 1 13 9 5<br>7 10 2 12 8 4 6 | 0 1 2 3 4 5 6 7 8 9 10 11 12 13 14 16 15 19 25 23 59 21 41<br>17 18 24 22 58 20 40 26 27 28 29 30 31 32 33 34 35 36 37<br>38 39 42 43 44 45 46 47 48 49 50 51 52 53 54 55 56 57 60<br>61 62 63 64 65 66 67 68 69 70 71 72 73 74 75 76 77 78 79<br>80 81 82 83 84 85 |
| 3 | 18  17 15 13 9<br>11 5 7 1 3 16<br>14 12 8 10 4<br>6 0 2 | 0 1 2 3 4 5 6 7 8 9 10 11 12 13 14 15 16 18 17 21 53 27 51<br>25 47 23 43 19 20 52 26 50 24 46 22 42 28 29 30 31 32 33<br>34 35 36 37 38 39 40 41 44 45 48 49 54 55 56 57 58 59 60<br>61 62 63 64 65 66 67 68 69 70 71 72 73 74 75 76 77 78 79<br>80 81 82 83 84 85 86 87 88 89 90 91 92 93 94 95 |
| 4 | 18  5 17 15 11<br>13 9 3 7 1 4<br>16 14 10 12<br>8 2 6 0 | 0 1 2 3 4 5 6 7 8 9 10 11 12 13 14 15 16 17 18 20 19 23 53<br>29 49 27 47 25 45 21 22 52 28 48 26 46 24 44 30 31 32 33<br>34 35 36 37 38 39 40 41 42 43 50 51 54 55 56 57 58 59 60<br>61 62 63 64 65 66 67 68 69 70 71 72 73 74 75 76 77 78 79<br>80 81 82 83 84 85 86 87 88 89 90 91 92 93 94 95 96 97 98<br>99 100 101 102 103 104 105 |
| 5 | 18  11 9 17 15 7<br>13 5 1 3 10 8<br>16 14 6 12 4<br>0 2 | 0 1 2 3 4 5 6 7 8 9 10 11 12 13 14 15 16 17 18 19 20 22 21<br>25 55 31 53 29 51 27 41 23 24 54 30 52 28 50 26 40 32 33<br>34 35 36 37 38 39 42 43 44 45 46 47 48 49 56 57 58 59 60<br>61 62 63 64 65 66 67 68 69 70 71 72 73 74 75 76 77 78 79<br>80 81 82 83 84 85 86 87 88 89 90 91 92 93 94 95 96 97 98<br>99 100 101 102 103 104 105 106 107 108 109 110 111 112 113<br>114 115 |

Locations of predetermined columns of each base matrix illustrated in FIG. 14A to FIG. 14F can be changed. The sixth column and the eleventh column in FIG. 14A can be transposed each other, the sixth column and the eighth column in FIG. 14B can be substituted each other, and the eighth column and the ninth column in FIG. 14C can be substituted each other. Also, the ninth column can be substituted for the tenth column in FIG. 14D, the tenth column can be substituted for the eleventh column in FIG. 14E, and the eleventh column can be substituted for the twelfth column in FIG. 14F. Table 2 to Table 7 respectively illustrate base matrixes generated when locations of two columns of each base matrix of FIG. 14A to FIG. 14F are substituted as aforementioned. Each base matrix of Table 2 to Table 7 has related parameter values $k_B$, $n_B$, $s_B$, and $L_{max}$, of which description can be obtained with reference to the description of each base matrix illustrated in FIG. 14A to FIG. 14F. In Table 2 to Table 7, row degree of the second column means the number of columns having "non-NULL" index in a corresponding row, and the third column represents the location of columns having "non-NULL" index (shift value) in a corresponding row. The fourth column of Table 2 to Table 7 represents a shift value of each column of "non-NULL" in a corresponding row. For example, columns having "non-NULL" index in the "0"th row of Table 2 are "1"st, "2"nd, "3"rd, "4"th, "8"th, and "9"th columns, and shift values of the respective columns are 1110, 680, 424, 180, 0, 0, respectively. Columns excluding the above columns in the "0"th row have index of "NULL", i.e., index which means a zero matrix. Matrixes of types as illustrated in FIG. 14A to FIG. 14F can be illustrated in accordance with information included in Table 2 to Table 7.

TABLE 2

| Row Index | Column Positions of non-NULL Indexes in Row | Shift Numbers of non-NULL Indexes in Row |
|---|---|---|
| 0 | 1, 2, 3, 4, 8, 9 | 110, 680, 424, 180, 0, 0 |
| 1 | 0, 2, 3, 6, 9, 10 | 702, 768, 863, 0, 0, 0 |
| 2 | 0, 1, 3, 4, 7, 10 | 360, 259, 652, 753, 0, 0 |
| 3 | 1, 4, 8, 20 | 402, 948, 0, 0 |
| 4 | 0, 5, 6, 20 | 318, 0, 767, 0 |
| 5 | 2, 5, 6, 7 | 154, 1023, 768, 0 |
| 6 | 0, 1, 11 | 885, 323, 0 |
| 7 | 0, 2, 12 | 617, 220, 0 |
| 8 | 1, 2, 3, 13 | 799, 519, 669, 0 |
| 9 | 0, 1, 4, 14 | 900, 72, 669, 0 |
| 10 | 0, 2, 6, 15 | 574, 253, 352, 0 |
| 11 | 1, 2, 7, 16 | 848, 280, 920, 0 |
| 12 | 0, 1, 5, 17 | 548, 928, 355, 0 |
| 13 | 0, 2, 3, 18 | 17, 376, 147, 0 |
| 14 | 0, 1, 4, 19 | 795, 823, 473, 0 |
| 15 | 0, 2, 8, 21 | 519, 424, 712, 0 |
| 16 | 1, 6, 22 | 952, 449, 0 |
| 17 | 2, 7, 23 | 887, 798, 0 |
| 18 | 0, 1, 9, 24 | 256, 93, 348, 0 |
| 19 | 2, 3, 25 | 492, 856, 0 |
| 20 | 1, 2, 10, 26 | 589, 1016, 705, 0 |
| 21 | 0, 4, 27 | 26, 166, 0 |
| 22 | 1, 2, 5, 28 | 525, 584, 845, 0 |
| 23 | 0, 8, 29 | 10, 331, 0 |
| 24 | 1, 9, 30 | 125, 310, 0 |
| 25 | 2, 10, 31 | 239, 641, 0 |
| 26 | 0, 1, 6, 32 | 557, 609, 448, 0 |

The base matrix according to Table 2 has parameter values such as $k_B=6$, $n_B=33$, $s_B=3$ and $L_{max}=1024$.

TABLE 3

| Row Index | Column Positions of non-NULL Indexes in Row | Shift Numbers of non-NULL Indexes in Row |
|---|---|---|
| 0 | 0, 1, 3, 4, 8, 11 | 556, 1023, 480, 944, 0, 0 |
| 1 | 0, 5, 6, 7, 21 | 430, 916, 0, 767, 0 |

TABLE 3-continued

| Row Index | Column Positions of non-NULL Indexes in Row | Shift Numbers of non-NULL Indexes in Row |
|---|---|---|
| 2 | 1, 3, 4, 9, 24 | 295, 907, 87, 0, 0 |
| 3 | 2, 4, 6, 7, 8 | 809, 501, 1023, 768, 0 |
| 4 | 1, 3, 9, 21 | 954, 710, 0, 0 |
| 5 | 2, 5, 10, 24, | 558, 360, 0, 0 |
| 6 | 2, 7, 11, 25 | 275, 0, 0, 0 |
| 7 | 0, 5, 10, 25 | 935, 568, 0, 0 |
| 8 | 0, 1, 12 | 195, 989, 0 |
| 9 | 0, 2, 13 | 550, 728, 0 |
| 10 | 1, 2, 3, 14 | 532, 26, 698, 0 |
| 11 | 0, 1, 4, 15 | 664, 862, 709, 0 |
| 12 | 0, 2, 5, 16 | 938, 440, 978, 0 |
| 13 | 1, 2, 8, 17 | 394, 995, 17, 0 |
| 14 | 0, 3, 7, 18 | 538, 175, 117, 0 |
| 15 | 1, 2, 6, 19 | 428, 105, 929, 0 |
| 16 | 0, 1, 9, 20 | 30, 264, 832, 0 |
| 17 | 0, 2, 10, 22 | 514, 410, 978, 0 |
| 18 | 1, 2, 4, 23 | 487, 249, 204, 0 |
| 19 | 0, 1, 11, 26 | 526, 126, 906, 0 |
| 20 | 0, 2, 5, 27 | 10, 90, 889, 0 |
| 21 | 1, 7, 28 | 126, 714, 0 |
| 22 | 2, 8, 29 | 312, 967, 0 |
| 23 | 0, 3, 6, 30 | 954, 302, 63, 0 |
| 24 | 0, 9, 31 | 33, 624, 0 |
| 25 | 0, 3, 4, 32 | 524, 752, 227, 0 |
| 26 | 1, 5, 33 | 647, 364, 0 |
| 27 | 2, 10, 34 | 918, 602, 0 |
| 28 | 0, 3, 4, 35 | 14, 131, 816, 0 |
| 29 | 1, 7, 36 | 216, 103, 0 |
| 30 | 2, 11, 37 | 893, 771, 0 |

The base matrix according to Table 3 has parameter values such as $k_B=7$, $n_B=38$, $s_B=3$ and $L_{max}=1024$.

TABLE 4

| Row Index | Column Positions of non-NULL Indexes in Row | Shift Numbers of non-NULL Indexes in Row |
|---|---|---|
| 0 | 0, 2, 3, 5, 6, 11, 12 | 719, 328, 939, 579, 765, 0, 0 |
| 1 | 0, 1, 3, 4, 5, 9, 12 | 955, 1019, 365, 503, 882, 0, 0 |
| 2 | 1, 4, 5, 10, 20 | 495, 720, 413, 0, 0 |
| 3 | 0, 6, 7, 8, 20 | 63, 163, 0, 767, 0 |
| 4 | 1, 3, 4, 10, 29 | 629, 319, 818, 0, 0 |
| 5 | 2, 6, 7, 8, 9 | 247, 412, 1023, 768, 0 |
| 6 | 2, 8, 11, 29 | 928, 0, 0, 0 |
| 7 | 0, 1, 13 | 32, 190, 0 |
| 8 | 0, 2, 14 | 243, 596, 0 |
| 9 | 1, 2, 3, 15 | 880, 833, 329, 0 |
| 10 | 0, 1, 4, 16 | 224, 840, 208, 0 |
| 11 | 2, 5, 9, 17 | 479, 222, 17, 0 |
| 12 | 0, 1, 6, 18 | 296, 856, 651, 0 |
| 13 | 2, 3, 8, 19 | 926, 211, 167, 0 |
| 14 | 0, 7, 13, 21 | 764, 166, 387, 0 |
| 15 | 1, 2, 10, 22 | 238, 925, 405, 0 |
| 16 | 3, 4, 14, 23 | 850, 922, 852, 0 |
| 17 | 0, 1, 5, 24 | 412, 96, 627, 0 |
| 18 | 0, 2, 11, 25 | 536, 443, 773, 0 |
| 19 | 1, 2, 12, 26 | 551, 91, 400, 0 |
| 20 | 0, 3, 6, 27 | 567, 242, 205, 0 |
| 21 | 1, 2, 8, 28 | 556, 157, 27, 0 |
| 22 | 0, 9, 30 | 10, 886, 0 |
| 23 | 1, 2, 20, 31 | 831, 252, 11, 0 |
| 24 | 0, 3, 4, 32 | 755, 623, 867, 0 |
| 25 | 1, 7, 33 | 608, 72, 0 |
| 26 | 0, 2, 10, 34 | 60, 516, 772, 0 |
| 27 | 1, 3, 5, 35 | 289, 906, 292, 0 |
| 28 | 2, 6, 36 | 600, 48, 0 |
| 29 | 0, 11, 37 | 565, 458, 0 |
| 30 | 0, 4, 8, 38 | 428, 6, 413, 0 |
| 31 | 1, 12, 39 | 958, 131, 0 |
| 32 | 2, 5, 40 | 577, 146, 0 |
| 33 | 1, 4, 6, 41 | 734, 257, 619, 0 |
| 34 | 2, 8, 42 | 612, 634, 0 |

The base matrix according to Table 4 has parameter values such as $k_B=8$, $n_B=43$, $s_B=3$ and $L_{max}=1024$.

TABLE 5

| Row Index | Column Positions of non-NULL Indexes in Row | Shift Numbers of non-NULL Indexes in Row |
|---|---|---|
| 0 | 1, 3, 5, 11, 21 | 854, 545, 457, 0, 0 |
| 1 | 0, 6, 8, 9, 21 | 282, 1001, 0, 767, 0 |
| 2 | 2, 5, 6, 12, 23 | 984, 677, 794, 0, 0 |
| 3 | 1, 4, 7, 11, 23 | 169, 618, 313, 0, 0 |
| 4 | 2, 3, 6, 13, 25 | 129, 699, 370, 0, 0 |
| 5 | 0, 4, 9, 12, 25 | 156, 934, 0, 0, 0 |
| 6 | 1, 4, 7, 13, 26 | 923, 840, 117, 0, 0 |
| 7 | 0, 3, 5, 10, 26 | 538, 243, 83, 0, 0 |
| 8 | 2, 7, 8, 9, 10 | 464, 1009, 1023, 768, 0 |
| 9 | 0, 1, 14 | 259, 434, 0 |
| 10 | 0, 1, 2, 15 | 274, 901, 1004, 0 |
| 11 | 0, 2, 14, 16 | 640, 997, 988, 0 |
| 12 | 1, 2, 10, 17 | 683, 54, 385, 0 |
| 13 | 0, 3, 4, 18 | 679, 253, 646, 0 |
| 14 | 1, 5, 6, 19 | 47, 418, 332, 0 |
| 15 | 2, 7, 9, 20 | 343, 26, 175, 0 |
| 16 | 0, 8, 15, 22 | 514, 671, 496, 0 |
| 17 | 1, 2, 11, 24 | 972, 433, 993, 0 |
| 18 | 0, 1, 12, 27 | 235, 223, 885, 0 |
| 19 | 0, 2, 13, 28 | 555, 943, 892, 0 |
| 20 | 1, 2, 21, 29 | 696, 574, 233, 0 |
| 21 | 0, 1, 23, 30 | 975, 510, 815, 0 |
| 22 | 0, 3, 4, 31 | 5, 818, 898, 0 |
| 23 | 2, 5, 32 | 350, 159, 0 |
| 24 | 0, 3, 6, 33 | 36, 397, 807, 0 |
| 25 | 1, 3, 7, 34 | 492, 502, 467, 0 |
| 26 | 1, 9, 35 | 162, 631, 0 |
| 27 | 2, 3, 10, 36 | 608, 944, 599, 0 |
| 28 | 2, 8, 37 | 394, 630, 0 |
| 29 | 0, 11, 38 | 48, 576, 0 |
| 30 | 1, 4, 10, 39 | 952, 521, 455, 0 |
| 31 | 2, 12, 40 | 304, 300, 0 |
| 32 | 0, 4, 5, 41 | 982, 602, 915, 0 |
| 33 | 1, 6, 42 | 740, 710, 0 |
| 34 | 0, 4, 7, 43 | 783, 491, 307, 0 |
| 35 | 1, 13, 44 | 431, 275, 0 |
| 36 | 2, 3, 5, 45 | 802, 46, 83, 0 |
| 37 | 2, 9, 46 | 556, 239, 0 |
| 38 | 4, 6, 47 | 812, 72, 0 |

The base matrix according to Table 5 has parameter values such as $k_B=9$, $n_B=48$, $s_B=3$ and $L_{max}=1024$.

TABLE 6

| Row Index | Column Positions of non-NULL Indexes in Row | Shift Numbers of non-NULL Indexes in Row |
|---|---|---|
| 0 | 0, 5, 6, 9, 10, 22 | 892, 146, 990, 0, 767, 0 |
| 1 | 1, 3, 4, 5, 12, 23 | 350, 577, 321, 15, 0, 0 |
| 2 | 2, 4, 7, 9, 10, 11 | 242, 771, 989, 1023, 768, 0 |
| 3 | 1, 3, 8, 12, 22 | 627, 183, 532, 0, 0 |
| 4 | 2, 7, 10, 13, 23 | 614, 847, 0, 0, 0 |
| 5 | 2, 7, 8, 14, 24 | 456, 923, 264, 0, 0 |
| 6 | 0, 5, 6, 13, 24 | 664, 365, 587, 0, 0 |
| 7 | 1, 3, 6, 14, 26 | 767, 882, 392, 0, 0 |
| 8 | 0, 4, 8, 11, 26 | 124, 908, 915, 0, 0 |
| 9 | 0, 1, 15 | 815, 184, 0 |
| 10 | 0, 1, 2, 16 | 476, 804, 646, 0 |
| 11 | 0, 2, 3, 17 | 6, 735, 10, 0 |
| 12 | 1, 2, 11, 18 | 512, 95, 710, 0 |
| 13 | 0, 4, 5, 19 | 949, 94, 860, 0 |
| 14 | 1, 6, 7, 20 | 191, 452, 860, 0 |
| 15 | 2, 8, 10, 21 | 455, 231, 802, 0 |
| 16 | 9, 15, 16, 25 | 489, 984, 736, 0 |
| 17 | 0, 1, 12, 27 | 555, 536, 777, 0 |
| 18 | 2, 3, 13, 28 | 527, 612, 534, 0 |
| 19 | 0, 1, 14, 29 | 21, 227, 461, 0 |
| 20 | 2, 3, 22, 30 | 897, 119, 618, 0 |
| 21 | 0, 4, 17, 31 | 530, 581, 453, 0 |
| 22 | 1, 2, 5, 32 | 977, 76, 139, 0 |

TABLE 6-continued

| Row Index | Column Positions of non-NULL Indexes in Row | Shift Numbers of non-NULL Indexes in Row |
|---|---|---|
| 23 | 0, 4, 6, 33 | 407, 302, 832, 0 |
| 24 | 1, 2, 23, 34 | 616, 233, 419, 0 |
| 25 | 0, 3, 7, 35 | 294, 500, 831, 0 |
| 26 | 1, 8, 36 | 994, 254, 0 |
| 27 | 2, 3, 24, 37 | 278, 1001, 589, 0 |
| 28 | 0, 3, 10, 38 | 4, 69, 141, 0 |
| 29 | 1, 3, 26, 39 | 956, 629, 420, 0 |
| 30 | 2, 11, 40 | 422, 541, 0 |
| 31 | 0, 3, 9, 41 | 816, 663, 475, 0 |
| 32 | 1, 3, 12, 42 | 349, 1010, 663, 0 |
| 33 | 2, 13, 43 | 94, 922, 0 |
| 34 | 0, 4, 5, 44 | 354, 776, 356, 0 |
| 35 | 1, 6, 45 | 995, 494, 0 |
| 36 | 2, 4, 7, 46 | 271, 911, 178, 0 |
| 37 | 0, 8, 47 | 7, 393, 0 |
| 38 | 1, 4, 10, 48 | 535, 888, 24, 0 |
| 39 | 2, 14, 49 | 854, 792, 0 |
| 40 | 4, 5, 50 | 792, 143, 0 |
| 41 | 3, 22, 51 | 170, 761, 0 |
| 42 | 3, 4, 6, 52 | 427, 900, 106, 0 |

The base matrix according to Table 6 has parameter values such as $k_B=10$, $n_B=53$, $s_B=3$ and $L_{max}=1024$.

TABLE 7

| Row Index | Column Positions of non-NULL Indexes in Row | Shift Numbers of non-NULL Indexes in Row |
|---|---|---|
| 0 | 1, 4, 8, 9, 13, 20 | 572, 998, 930, 221, 0, 0 |
| 1 | 0, 5, 6, 10, 11, 20 | 340, 579, 789, 0, 767, 0 |
| 2 | 1, 3, 6, 7, 13, 25 | 368, 46, 358, 978, 0, 0 |
| 3 | 0, 4, 7, 9, 14, 26 | 921, 128, 589, 32, 0, 0 |
| 4 | 0, 4, 5, 8, 12, 27 | 757, 230, 714, 823, 0, 0 |
| 5 | 2, 3, 7, 10, 11, 12 | 729, 583, 1, 1023, 768, 0 |
| 6 | 2, 5, 8, 14, 25 | 997, 211, 438, 0, 0 |
| 7 | 2, 3, 11, 15, 26 | 418, 127, 0, 0, 0 |
| 8 | 1, 6, 9, 15, 27 | 598, 570, 943, 0, 0 |
| 9 | 0, 1, 16 | 847, 386, 0 |
| 10 | 0, 1, 2, 17 | 371, 107, 268, 0 |
| 11 | 0, 2, 3, 18 | 119, 226, 30, 0 |
| 12 | 1, 2, 12, 19 | 355, 74, 27, 0 |
| 13 | 4, 5, 6, 21 | 310, 74, 15, 0 |
| 14 | 0, 7, 8, 22 | 394, 952, 73, 0 |
| 15 | 1, 2, 9, 23 | 55, 95, 768, 0 |
| 16 | 10, 11, 16, 24 | 912, 973, 727, 0 |
| 17 | 0, 13, 17, 28 | 697, 518, 709, 0 |
| 18 | 1, 3, 18, 29 | 226, 568, 330, 0 |
| 19 | 2, 4, 14, 30 | 41, 113, 948, 0 |
| 20 | 0, 3, 15, 31 | 31, 698, 549, 0 |
| 21 | 1, 4, 5, 32 | 262, 256, 243, 0 |
| 22 | 0, 2, 20, 33 | 574, 60, 651, 0 |
| 23 | 1, 5, 6, 34 | 946, 464, 986, 0 |
| 24 | 2, 6, 7, 35 | 684, 243, 20, 0 |
| 25 | 0, 3, 8, 36 | 541, 250, 136, 0 |
| 26 | 1, 2, 9, 37 | 265, 559, 896, 0 |
| 27 | 0, 4, 11, 38 | 699, 43, 320, 0 |
| 28 | 0, 1, 25, 39 | 24, 47, 193, 0 |
| 29 | 2, 26, 40 | 479, 995, 0 |
| 30 | 0, 5, 7, 41 | 44, 855, 57, 0 |
| 31 | 1, 2, 27, 42 | 150, 720, 179, 0 |
| 32 | 1, 3, 8, 43 | 168, 140, 985, 0 |
| 33 | 2, 12, 44 | 689, 429, 0 |
| 34 | 0, 4, 6, 45 | 515, 385, 75, 0 |
| 35 | 1, 5, 10, 46 | 75, 396, 1017, 0 |
| 36 | 0, 13, 47 | 31, 388, 0 |
| 37 | 1, 6, 7, 48 | 226, 123, 612, 0 |
| 38 | 2, 14, 49 | 509, 38, 0 |
| 39 | 2, 7, 8, 50 | 726, 430, 767, 0 |
| 40 | 3, 8, 51 | 838, 277, 0 |
| 41 | 4, 9, 52 | 383, 745, 0 |
| 42 | 3, 5, 53 | 772, 267, 0 |
| 43 | 6, 9, 54 | 270, 297, 0 |
| 44 | 4, 7, 55 | 743, 598, 0 |
| 45 | 5, 12, 56 | 66, 373, 0 |
| 46 | 3, 6, 8, 57 | 455, 973, 737, 0 |

The base matrix according to Table 7 has parameter values such as $k_B=11$, $n_B=58$, $s_B=3$ and $L_{max}=1024$.

Table 8 illustrates permutation patterns for making the parity part having a dual diagonal structure through permutation of rows and columns of the base matrixes illustrated in Table 2 to Table 7. In Table 8, i means index of the base matrix, $K_i$ means the number of multiplexing chains, $Q_i$ means a row permutation pattern for permutation of rows, and $P_i$ means a column permutation pattern for permutation of columns. In Table 8, rows are permuted by the number ($K_i$) of multiplexing chains.

TABLE 8

| i | $K_i$ | $Q_i$ | $P_i$ |
|---|---|---|---|
| 0 | 12 | 11 5 3 1 7 9 10 4 2 0 6 8 | 0 1 2 3 4 5 6 7 8 9 10 12 13 15 21 19 17 41 11 14 20 18 16 40 22 23 24 25 26 27 28 29 30 31 32 33 34 35 36 37 38 39 42 43 44 45 46 47 48 49 50 51 52 53 54 55 56 57 58 59 60 61 62 63 64 65 |
| 1 | 16 | 7 1 13 15 11 5 9 3 6 0 12 14 10 4 8 2 | 0 1 2 3 4 5 6 7 8 9 10 11 12 14 15 17 23 51 21 49 19 43 13 16 22 50 20 48 18 42 24 25 26 27 28 29 30 31 32 33 34 35 36 37 38 39 40 41 44 45 46 47 52 53 54 55 56 57 58 59 60 61 62 63 64 65 66 67 68 69 70 71 72 73 74 75 |
| 2 | 14 | 11 3 1 13 9 5 7 10 2 12 8 4 6 | 0 1 2 3 4 5 6 7 8 9 10 11 12 13 14 16 17 19 25 23 59 21 41 15 18 24 22 58 20 40 26 27 28 29 30 31 32 33 34 35 36 37 38 39 42 43 44 45 46 47 48 49 50 51 52 53 54 55 56 57 60 61 62 63 64 65 66 67 68 69 70 71 72 73 74 75 76 77 78 79 80 81 82 83 84 85 |
| 3 | 18 | 17 15 13 9 11 5 7 1 3 16 14 12 8 10 4 6 0 2 | 0 1 2 3 4 5 6 7 8 9 10 11 12 13 14 15 16 18 19 21 53 27 51 25 47 23 43 17 20 52 26 50 24 46 22 42 28 29 30 31 32 33 34 35 36 37 38 39 40 41 44 45 48 49 54 55 56 57 58 59 60 61 62 63 64 65 66 67 68 69 70 71 72 73 74 75 76 77 78 79 80 81 82 83 84 85 86 87 88 89 90 91 92 93 94 95 |
| 4 | 18 | 5 17 15 11 13 9 3 7 1 4 16 14 10 12 8 2 6 0 | 0 1 2 3 4 5 6 7 8 9 10 11 12 13 14 15 16 17 18 20 21 23 53 29 49 27 47 25 45 19 22 52 28 48 26 46 24 44 30 31 32 33 34 35 36 37 38 39 40 41 42 43 50 51 54 55 56 57 58 59 60 61 62 63 64 65 66 67 68 69 70 71 72 73 74 75 76 77 78 79 80 81 82 83 84 85 86 87 88 89 90 91 92 93 94 95 96 97 98 99 100 101 102 103 104 105 |

TABLE 8-continued

| i | $K_i$ | $Q_i$ | $P_i$ |
|---|---|---|---|
| 5 | 18 | 11 9 17 15 7 13 5<br>1 3 10 8 16 14 6<br>12 4 0 2 | 0 1 2 3 4 5 6 7 8 9 10 11 12 13 14 15 16 17 18 19 20 22 23<br>25 55 31 53 29 51 27 41 21 24 54 30 52 26 40 32 33<br>34 35 36 37 38 39 42 43 44 45 46 47 48 49 56 57 58 59 60<br>61 62 63 64 65 66 67 68 69 70 71 72 73 74 75 76 77 78 79<br>80 81 82 83 84 85 86 87 88 89 90 91 92 93 94 95 96 97 98<br>99 100 101 102 103 104 105 106 107 108 109 110 111<br>112 113 114 115 |

Hereinafter, an example of a method of generating a binary parity check matrix H from the fourth base matrix (G''') generated from the first base matrix of Table 2 to Table 7 in accordance with the embodiment of the present invention and encoding input data streams ($V^{in}$) using the generated parity check matrix will be described. The input data streams can include a cyclic redundancy check (CRC) code according to a CRC algorithm.

The parity check matrix is generated in such a manner that an element having "non-NULL" index of the third base matrix is replaced with a sub-matrix of L/2×L/2 size indicated by a corresponding index and an element corresponding to "NULL" is replaced with a zero matrix of L/2×L/2 size.

"0" bits equivalent to zp(=$k_B$L-k) are added to the input data streams ($V^{in}$) having a length of 'k' before encoding, so as to obtain a packet having a length of $k_B$L. When a packet having a length of $k_B$L is $V^I$, $V^I$ is expressed as a column vector $V^I = (V^I_0, V^I_1, \ldots, V^I_{k'-1})$. At this time, k'=$k_B$L is obtained. Locations of "0" bits in $V^I$ are as follows. When $V^I$ is divided into $2k_B$ blocks of L/2 size, "0" bits are inserted to the end of the $(2k_B-4)_{th}$ and $(2k_B-3)_{th}$ blocks. When zp is an even number, each block has "0" bits of the same number. When zp is an odd number, the $(2k_B-3)_{th}$ block has "0" bits more than those of the $(2k_B-4)_{th}$ block by one.

When zp'=$\lfloor zp/2 \rfloor$ and zp''=$\lceil zp/2 \rceil$ are defined, and when $V^I_i$ and $V^{in}_i$ are respectively defined as $i_{th}$ elements of $V^I$ and $V^{in}$, elements of vector $V^I$ are given by the following equation 7.

$V^I_i = V^{in}_i$ for $i < (2k_B-3)(L/2)-zp'$ $V^I_i = 0$ for $(2k_B-3)(L/2)-zp' \leq i < (2k_B-3)(L/2)$ $V^I_i = V^{in}_i - zp'$ for $(2k_B-3)(L/2) \leq i < (2k_B-2)(L/2)-zp'$ $V^I_i = 0$ for $(2k_B-2)(L/2)-zp'' \leq i < (2k_B-2)(L/2)$ $V^I_i = V^{in}_i - zp$ for $i \leq (2k_B-2)(L/2)$  [Equation 7]

The vector V''' having a length of $n_B$L is defined as a vector which satisfies HV'''=0. In this case, matrix multiplication HV''' is performed in a binary field. In other words, vector V''' means a codeword obtained by encoding vector $V^I$ through the parity check matrix. First $k_B$L number of elements of the vector V''' are equal to elements of $V^I$. The vector V''' has a length of $n_B$L.

Permutation is applied to the order of the vector V''' in accordance with an inverse order of the column permutation pattern $P_i$ so as to obtain a binary data stream V''. A binary data stream $V^O$ having a length of $n_B$L is obtained by performing interleaving of the data stream V'' in accordance with the following equation 8.

$V^O_{jL+j} = V''_{jL+(L/2)(j' \bmod 2)+\lfloor j''/2 \rfloor}$, wherein j=0, 1, ..., $n_B$-1, j'=0, 1, ..., L-1  [Equation 8]

LDPC output vector $V^{out}$ having a length of n(=$Ln_B - s_B L - (k_B L - k)$) is obtained by removing "0" bit padding and state variables from the vector $V^O$. $V^{out}$ is expressed as the following equation 9.

$V^{out}_i = V^O_{i+3L}$ for $0 \leq i < k-4L$ $V^{out}_i = V^O_{i+3L+zp}$ for $k-4L \leq i < (n_B-3)L-$ 계  [Equation 9]

Figure 15A:
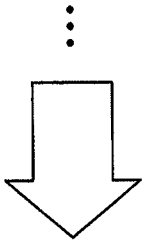
FIG. 15A and FIG. 15B are diagrams illustrating another embodiments of the present invention.
Figure 15A:
Figure 15B:

FIG. 15A and FIG. 15B illustrate another embodiments of the present invention, in which technical features of the present invention are applied to a base matrix (corresponding to the case where the number of six information blocks is 6) according to the 3GPP2 standard which is a technical standard of an asynchronous mobile communication system. FIG. 15A illustrates an example of modifying a parity part to a dual diagonal structure through row/column permutation in the step of the first base matrix (G) or the second base matrix (G'), and FIG. 15B illustrates an example of configuring a dual diagonal structure in the step of the third base matrix (G").

Figure 16A:
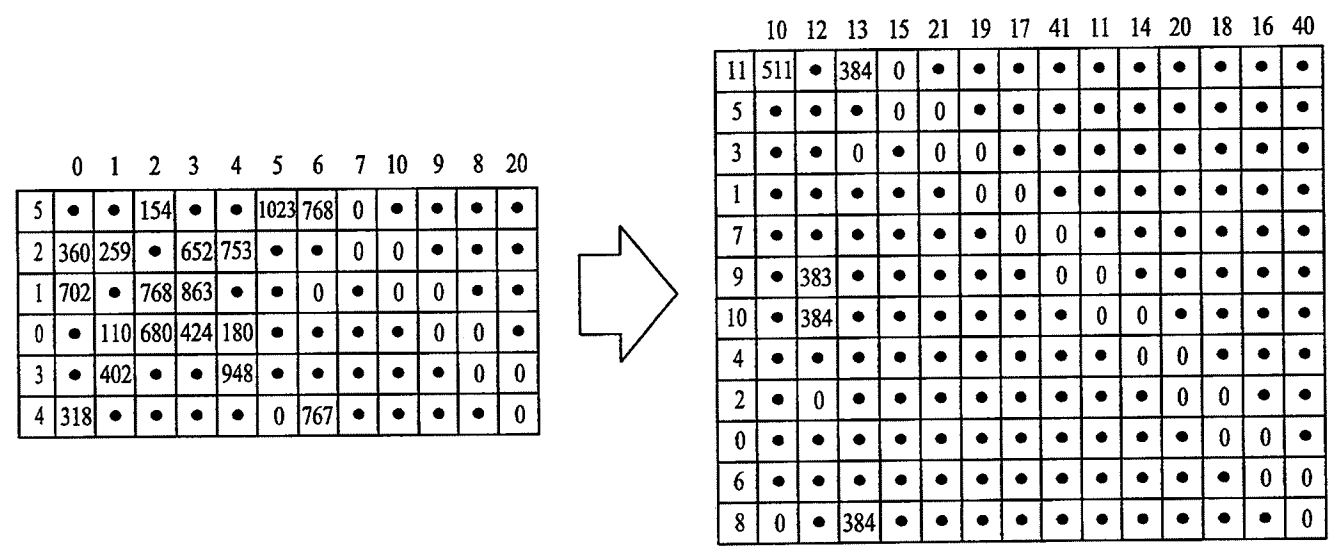

FIG. 16A to FIG. 16C illustrate examples of row/column permutation methods according to one embodiment of the present invention, in which the number of information blocks is 6 ($k_B$=6).

In FIG. 16A, a left matrix and a right matrix respectively illustrate a part of a matrix obtained by modifying the parity part of the base matrix of the 3GPP2 standard, which is in the course of expansion, to a dual diagonal type, and a party of a finally expanded parity check matrix. Namely, the left matrix is a part of a base matrix in which rows and columns are permuted to obtain a parity part of a dual diagonal structure when sequence indexes are used for rows and columns of the first base matrix, and the right matrix is a part of an expanded parity check matrix having a parity part of a dual diagonal structure, which is permuted from the first base matrix. Meanwhile, although this procedure may be performed in such a manner that the parity part in the base matrix is permuted to obtain a dual diagonal structure and then modified to a finally expanded parity check matrix like the embodiments which will be described later, the base matrix may directly be modified to a final parity check matrix having a parity part of a dual diagonal structure.

FIG. 16B and FIG. 16C respectively mean the permutation order when columns and rows are permuted to modify the parity part to the dual diagonal structure in the 2×2 expansion procedure.

Figure 17A:
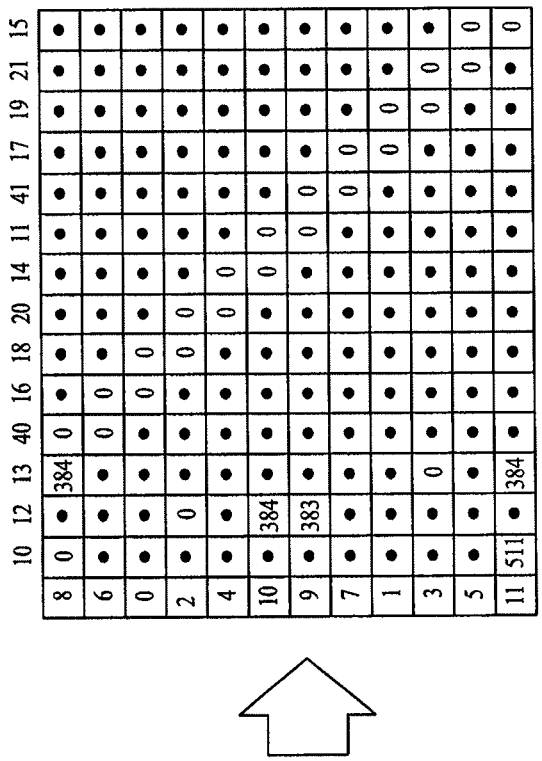

FIG. 17A to FIG. 17C illustrate examples of row/column permutation methods according to another embodiment of the present invention, in which the number of information blocks is 6 ($k_B$=6). In FIG. 17A, a left matrix and a right matrix are the same as those described in FIG. 16A. For description of the FIG. 17B and FIG. 17C, the description of FIG. 16B and FIG. 16C can be referred to. Likewise, for description of FIG. 18A to FIG. 27C, the description of FIG. 16B and FIG. 16C can be referred to.

Figure 18A:

FIG. 18A to FIG. 18C illustrate examples of row/column permutation methods according to another embodiment of the present invention, in which the number of information blocks is 7 ($k_B$=7).

Figure 19A:
Figure 19B:
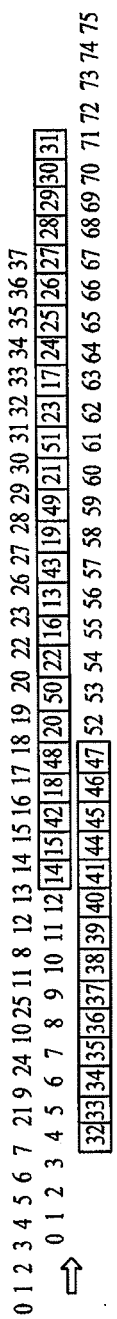
Figure 19C:
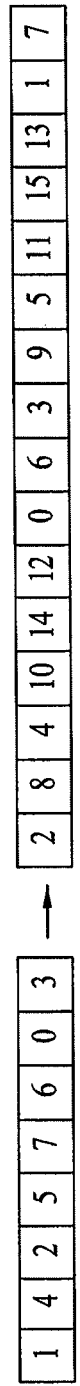

FIG. 19A to FIG. 19C illustrate examples of row/column permutation methods according to another embodiment of the present invention, in which the number of information blocks is 7 ($k_B=7$).

Figure 20A:
Figures 20B, 20C:
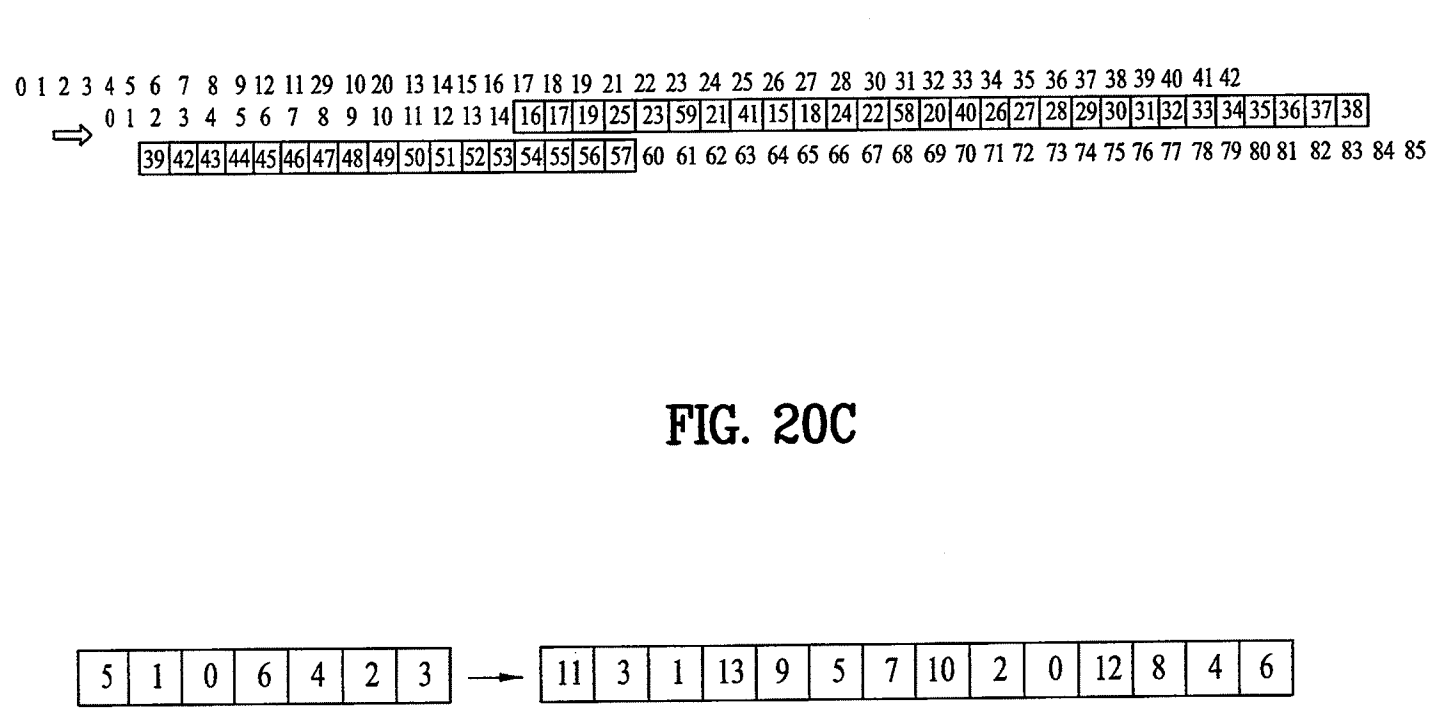

FIG. 20A to FIG. 20C illustrate examples of row/column permutation methods according to another embodiment of the present invention, in which the number of information blocks is 8 ($k_B=8$).

Figure 21A:

FIG. 21A to FIG. 21C illustrate examples of row/column permutation methods according to another embodiment of the present invention, in which the number of information blocks is 8 ($k_B=8$).

Figure 22A:
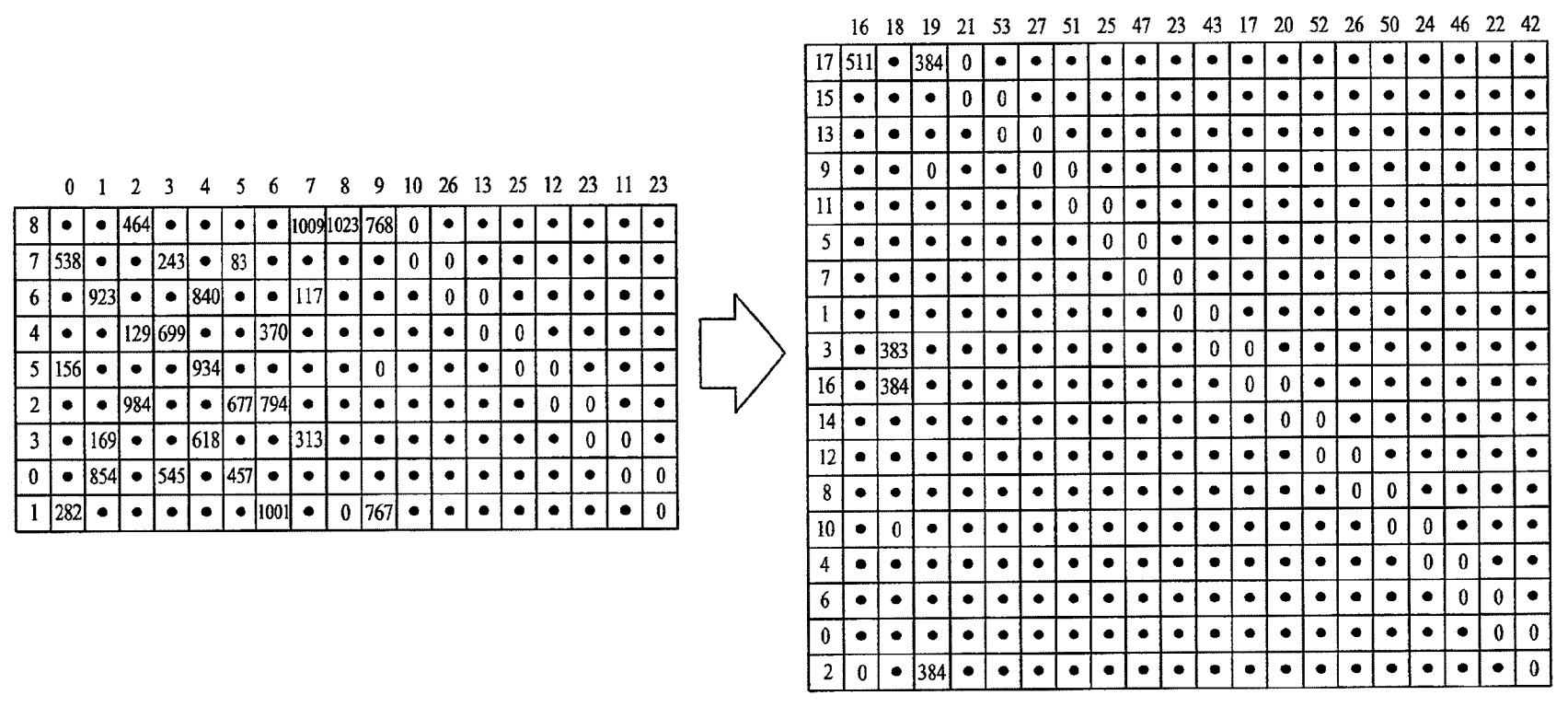
Figures 22B, 22C:
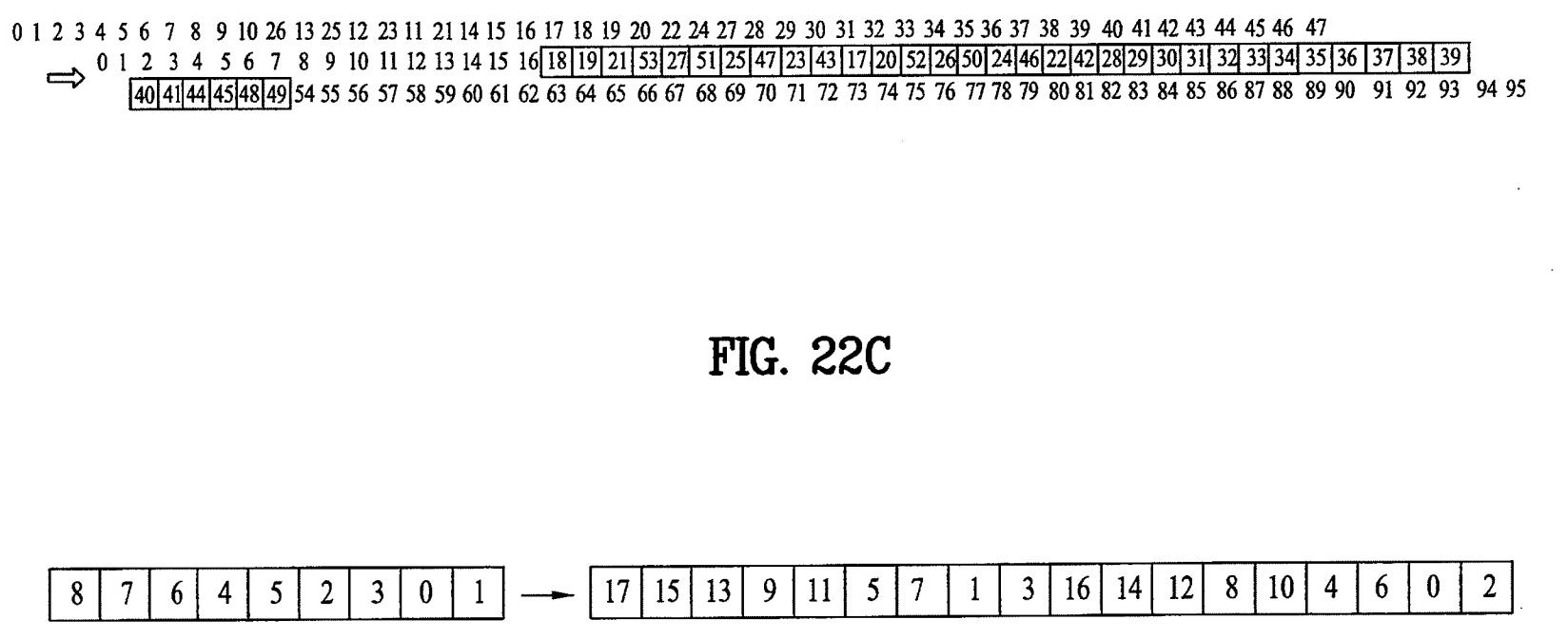

FIG. 22A to FIG. 22C illustrate examples of row/column permutation methods according to another embodiment of the present invention, in which the number of information blocks is 9 ($k_B=9$).

Figure 23A:
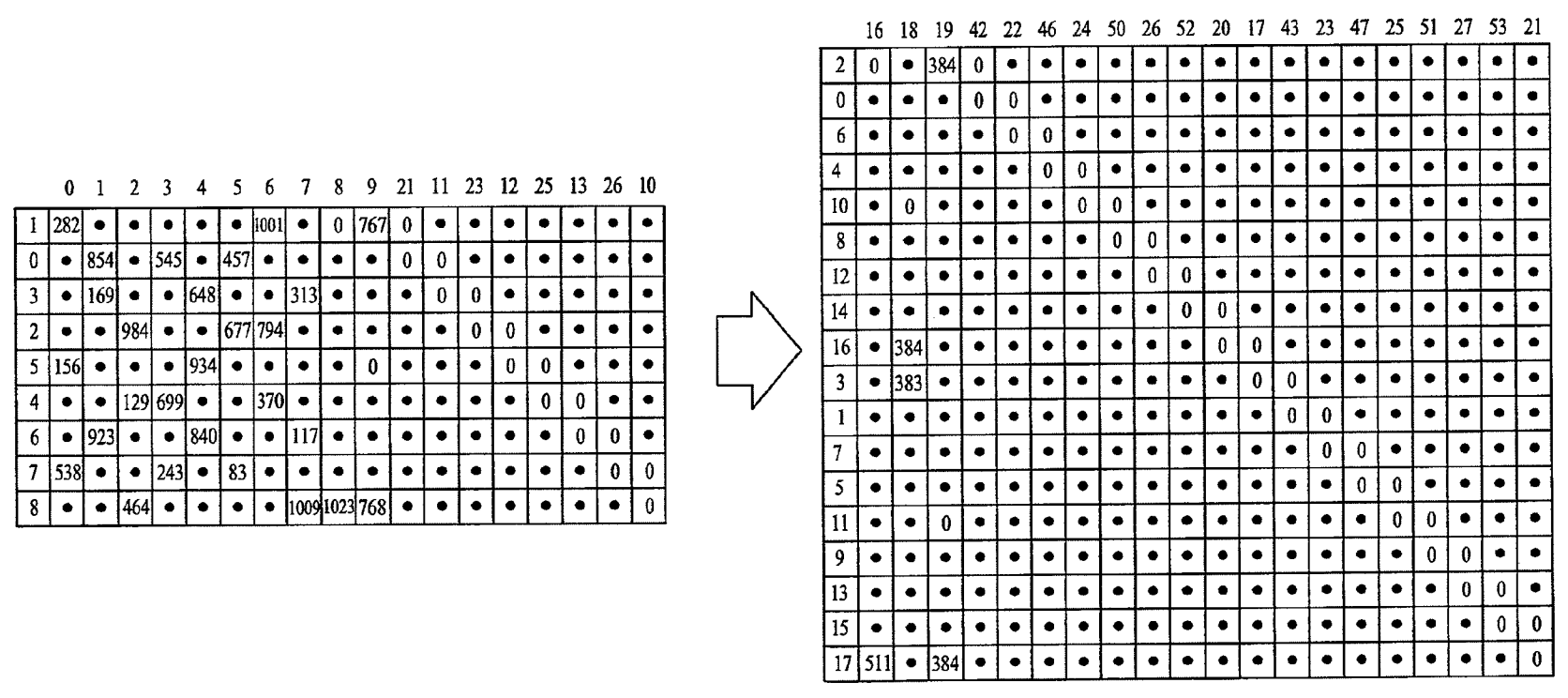
Figures 23B, 23C:
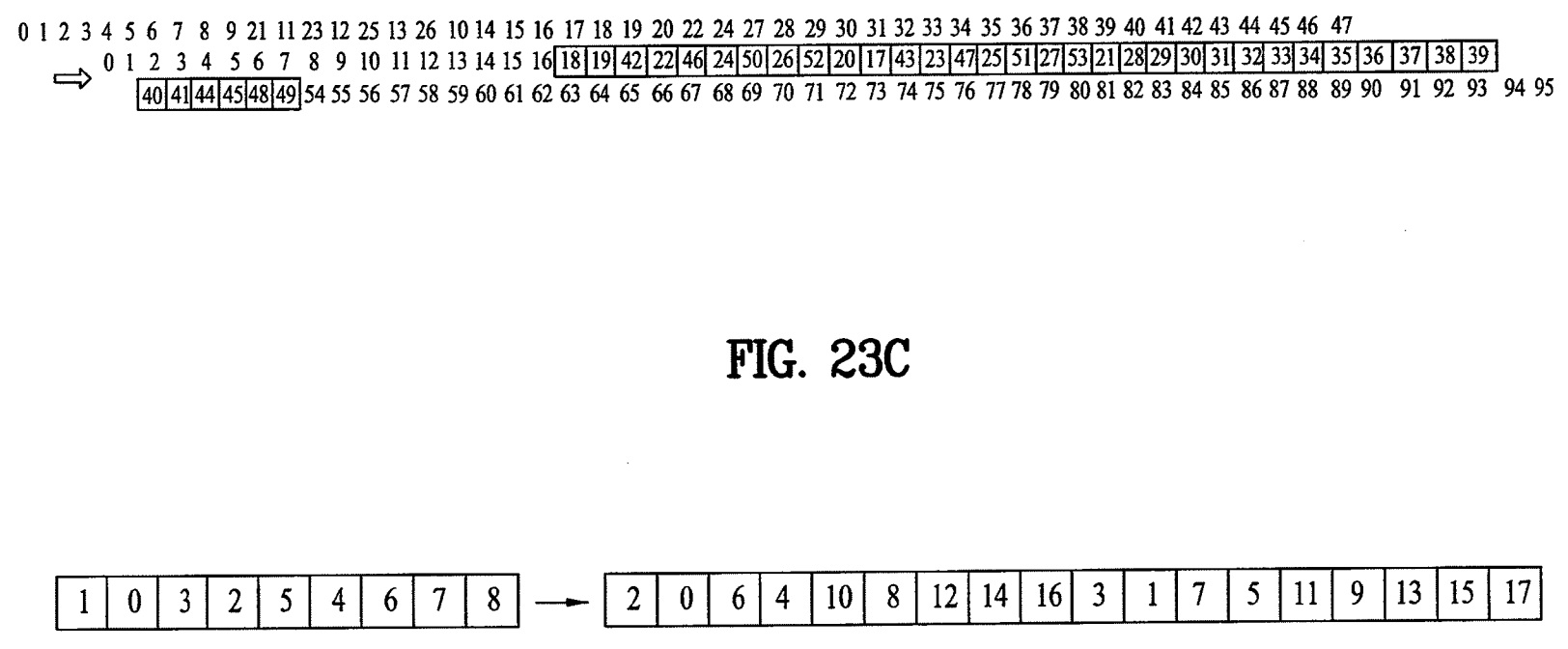

FIG. 23A to FIG. 23C illustrate examples of row/column permutation methods according to another embodiment of the present invention, in which the number of information blocks is 9 ($k_B=9$).

Figure 24A:
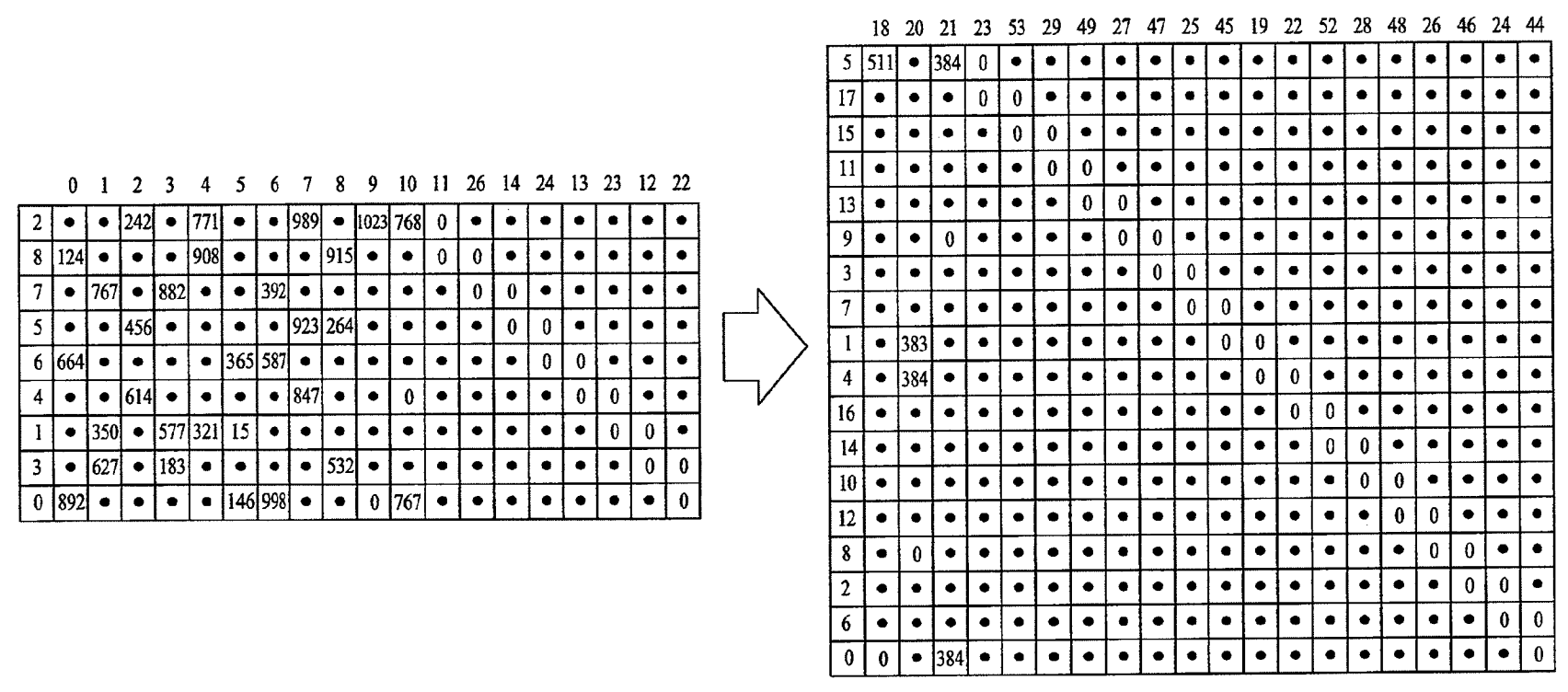
Figure 24B:
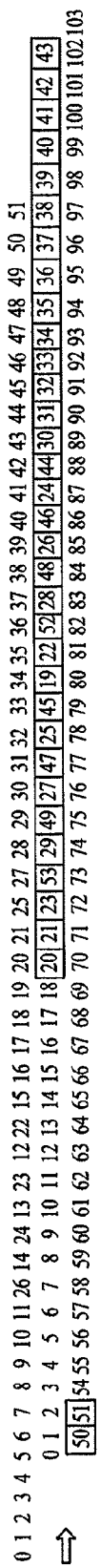
Figure 24C:

FIG. 24A to FIG. 24C illustrate examples of row/column permutation methods according to another embodiment of the present invention, in which the number of information blocks is 10 ($k_B=10$).

Figure 25A:
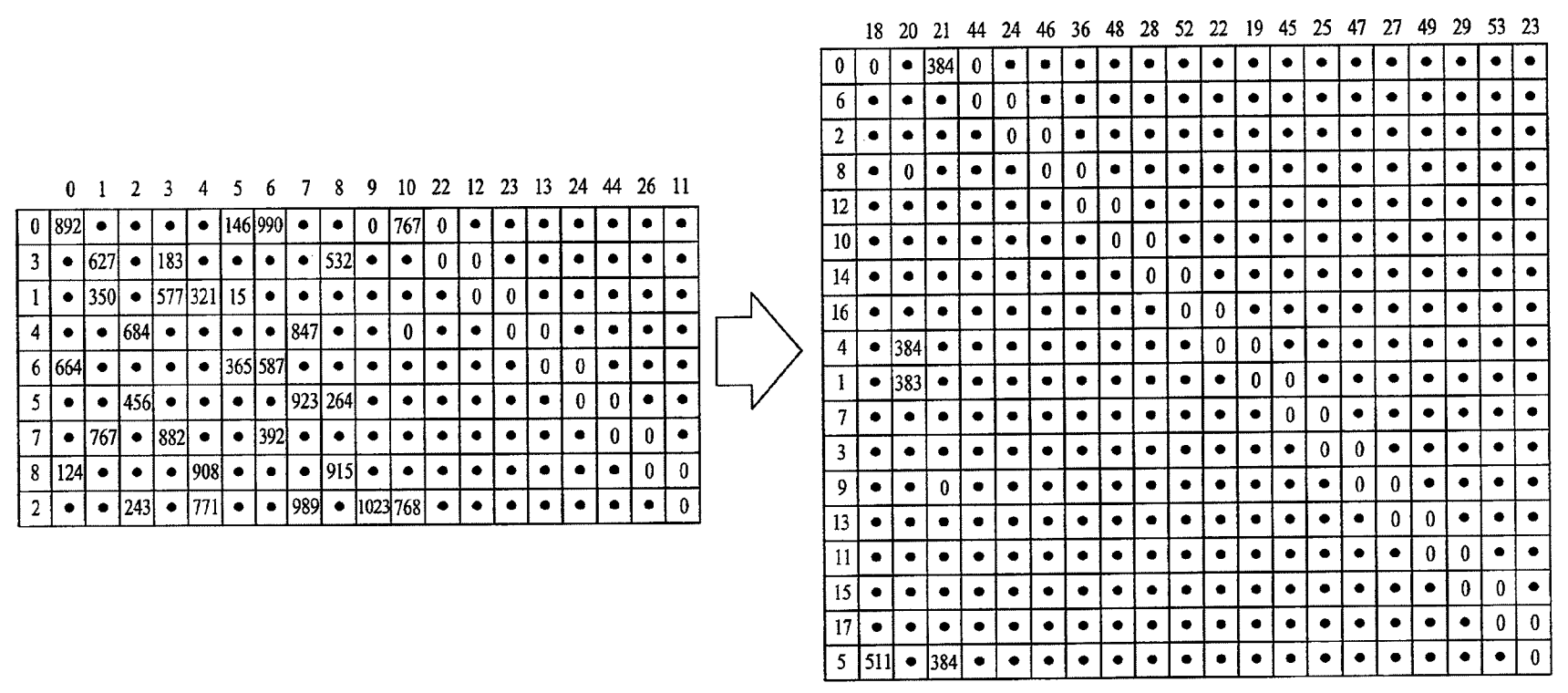

FIG. 25A to FIG. 25C illustrate examples of row/column permutation methods according to another embodiment of the present invention, in which the number of information blocks is 10 ($k_B=10$).

Figure 26A:
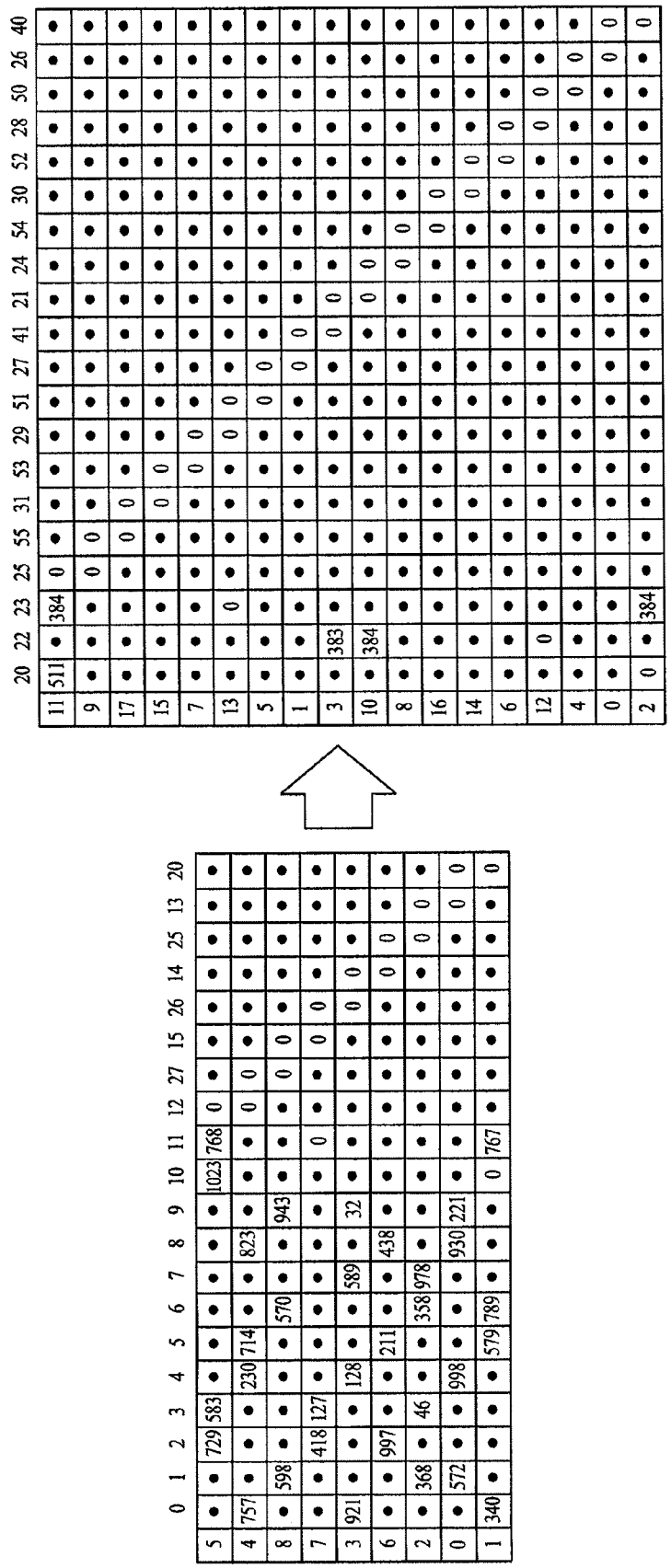

FIG. 26A to FIG. 26C illustrate examples of row/column permutation methods according to another embodiment of the present invention, in which the number of information blocks is 11 ($k_B=11$).

Figure 27A:
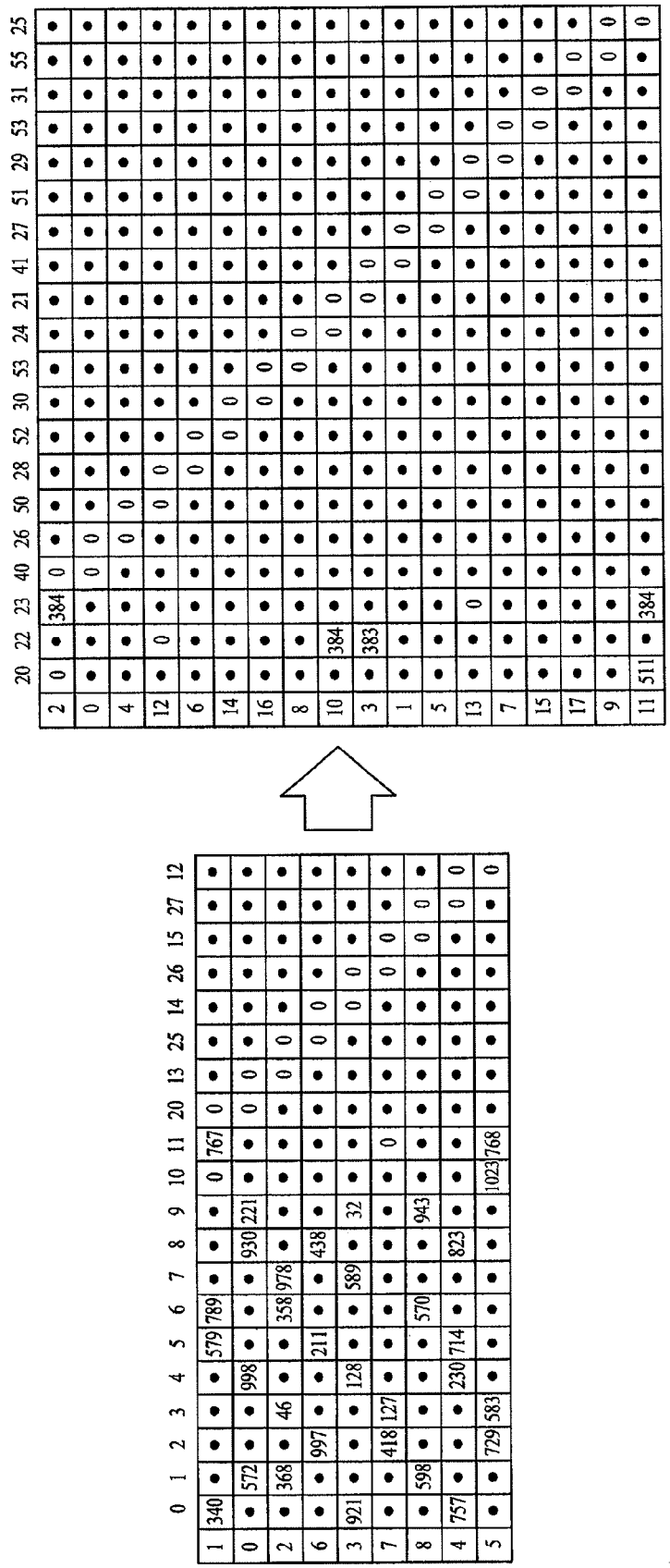
Figures 27B, 27C:
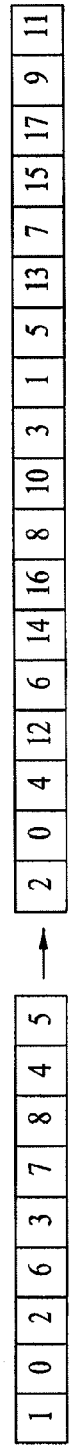

FIG. 27A to FIG. 27C illustrate examples of row/column permutation methods according to another embodiment of the present invention, in which the number of information blocks is 11 ($k_B=11$).

According to the embodiments of the present invention, it is possible to reduce complexity in the procedure of LDPC encoding and decoding, and to more simply support a retransmission function such as ARQ or HARQ.

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments according to the present invention may be implemented by various means, for example, hardware, firmware, software, or their combination. If the embodiment according to the present invention is implemented by hardware, the embodiment of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the method of transmitting and receiving data in the wireless communication system according to the embodiment of the present invention may be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

Industrial Applicability

The present invention can be applied to every field where encoding and decoding are used, as well as a wireless communication system such as a mobile communication system or a wireless Internet system.

The invention claimed is:

1. A method for encoding data using a parity check matrix, the method comprising:
generating a second base matrix by replacing each index of a first base matrix including a plurality of indexes, each of the plurality of indexes indicating a sub-matrix, with another index determined based on a flooring operation;
generating a third base matrix by expanding each index of the second base matrix including a plurality of indexes, each of the plurality of indexes indicating a sub-matrix, into an index matrix including two or more indexes;
generating a fourth base matrix by applying a row permutation pattern and a column permutation pattern to rows and columns of the third base matrix, respectively, the third base matrix including a plurality of indexes, each of the plurality of indexes indicating a sub-matrix;
generating the parity check matrix by replacing each index of the fourth base matrix with a corresponding sub-matrix;
outputting an encoded bit stream by encoding an input bit stream using the generated parity check matrix; and
permuting an order of sequences of the encoded bit stream according to an inverse of the column permutation pattern.

2. The method of claim 1, wherein the first base matrix is defined by the following table:

| Row Index | Column Positions of non-NULL Indexes in Row | Shift Numbers of non-NULL Indexes in Row |
| --- | --- | --- |
| 0 | 1, 2, 3, 4, 8, 9 | 110, 680, 424, 180, 0, 0 |
| 1 | 0, 2, 3, 6, 9, 10 | 702, 768, 863, 0, 0, 0 |
| 2 | 0, 1, 3, 4, 7, 10 | 360, 259, 652, 753, 0, 0 |
| 3 | 1, 4, 8, 20 | 402, 948, 0, 0 |
| 4 | 0, 5, 6, 20 | 318, 0, 767, 0 |
| 5 | 2, 5, 6, 7 | 154, 1023, 768, 0 |
| 6 | 0, 1, 11 | 885, 323, 0 |
| 7 | 0, 2, 12 | 617, 220, 0 |
| 8 | 1, 2, 3, 13 | 799, 519, 669, 0 |

-continued

| Row Index | Column Positions of non-NULL Indexes in Row | Shift Numbers of non-NULL Indexes in Row |
|---|---|---|
| 9 | 0, 1, 4, 14 | 900, 72, 669, 0 |
| 10 | 0, 2, 6, 15 | 574, 253, 352, 0 |
| 11 | 1, 2, 7, 16 | 848, 280, 920, 0 |
| 12 | 0, 1, 5, 17 | 548, 928, 355, 0 |
| 13 | 0, 2, 3, 18 | 17, 376, 147, 0 |
| 14 | 0, 1, 4, 19 | 795, 823, 473, 0 |
| 15 | 0, 2, 8, 21 | 519, 424, 712, 0 |
| 16 | 1, 6, 22 | 952, 449, 0 |
| 17 | 2, 7, 23 | 887, 798, 0 |
| 18 | 0, 1, 9, 24 | 256, 93, 348, 0 |
| 19 | 2, 3, 25 | 492, 856, 0 |
| 20 | 1, 2, 10, 26 | 589, 1016, 705, 0 |
| 21 | 0, 4, 27 | 26, 166, 0 |
| 22 | 1, 2, 5, 28 | 525, 584, 845, 0 |
| 23 | 0, 8, 29 | 10, 331, 0 |
| 24 | 1, 9, 30 | 125, 310, 0 |
| 25 | 2, 10, 31 | 239, 641, 0 |
| 26 | 0, 1, 6, 32 | 557, 609, 448, 0 | and wherein the row permutation pattern ($Q_i$) and the column permutation pattern ($P_i$) are of the following table:

| $Q_i$ | $P_i$ |
|---|---|
| 11 5 3 1 7 9<br>10 4 2 0 6 8 | 0 1 2 3 4 5 6 7 8 9 10 12 13 15 21 19 17 41 11 14 20 18 16<br>40 22 23 24 25 26 27 28 29 30 31 32 33 34 35 36 37 38 39<br>42 43 44 45 46 47 48 49 50 51 52 53 54 55 56 57 58 59 60<br>61 62 63 64 65. |

3. The method of claim 1, wherein the first base matrix is defined by the following table:

| Row Index | Column Positions of non-NULL Indexes in Row | Shift Numbers of non-NULL Indexes in Row |
|---|---|---|
| 0 | 0, 1, 3, 4, 8, 11 | 556, 1023, 480, 944, 0, 0 |
| 1 | 0, 5, 6, 7, 21 | 430, 916, 0, 767, 0 |
| 2 | 1, 3, 4, 9, 24 | 295, 907, 87, 0, 0 |
| 3 | 2, 4, 6, 7, 8 | 809, 501, 1023, 768, 0 |
| 4 | 1, 3, 9, 21 | 954, 710, 0, 0 |
| 5 | 2, 5, 10, 24, | 558, 360, 0, 0 |
| 6 | 2, 7, 11, 25 | 275, 0, 0, 0 |
| 7 | 0, 5, 10, 25 | 935, 568, 0, 0 |
| 8 | 0, 1, 12 | 195, 989, 0 |
| 9 | 0, 2, 13 | 550, 728, 0 |
| 10 | 1, 2, 3, 14 | 532, 26, 698, 0 |
| 11 | 0, 1, 4, 15 | 664, 862, 709, 0 |
| 12 | 0, 2, 5, 16 | 938, 440, 978, 0 |
| 13 | 1, 2, 8, 17 | 394, 995, 17, 0 |
| 14 | 0, 3, 7, 18 | 538, 175, 117, 0 |
| 15 | 1, 2, 6, 19 | 428, 105, 929, 0 |
| 16 | 0, 1, 9, 20 | 30, 264, 832, 0 |
| 17 | 0, 2, 10, 22 | 514, 410, 978, 0 |
| 18 | 1, 2, 4, 23 | 487, 249, 204, 0 |
| 19 | 0, 1, 11, 26 | 526, 126, 906, 0 |
| 20 | 0, 2, 5, 27 | 10, 90, 889, 0 |
| 21 | 1, 7, 28 | 126, 714, 0 |
| 22 | 2, 8, 29 | 312, 967, 0 |
| 23 | 0, 3, 6, 30 | 954, 302, 63, 0 |
| 24 | 0, 9, 31 | 33, 624, 0 |
| 25 | 0, 3, 4, 32 | 524, 752, 227, 0 |
| 26 | 1, 5, 33 | 647, 364, 0 |
| 27 | 2, 10, 34 | 918, 602, 0 |
| 28 | 0, 3, 4, 35 | 14, 131, 816, 0 |
| 29 | 1, 7, 36 | 216, 103, 0 |
| 30 | 2, 11, 37 | 893, 771, 0 | and wherein the row permutation pattern ($Q_i$) and the column permutation pattern ($P_i$) are of the following table:

| $Q_i$ | $P_i$ |
|---|---|
| 7 1 13 15 11<br>5 9 3 6 0 12<br>14 10 4 8 2 | 0 1 2 3 4 5 6 7 8 9 10 11 12 14 15 17 23 51 21 49 19 43 13<br>16 22 50 20 48 18 42 24 25 26 27 28 29 30 31 32 33 34 35<br>36 37 38 39 40 41 44 45 46 47 52 53 54 55 56 57 58 59 60<br>61 62 63 64 65 66 67 68 69 70 71 72 73 74 75. |

4. The method of claim 1, wherein the first base matrix is defined by the following table:

| Row Index | Column Positions of non-NULL Indexes in Row | Shift Numbers of non-NULL Indexes in Row |
|---|---|---|
| 0 | 0, 2, 3, 5, 6, 11, 12 | 719, 328, 939, 579, 765, 0, 0 |
| 1 | 0, 1, 3, 4, 5, 9, 12 | 955, 1019, 365, 503, 882, 0, 0 |
| 2 | 1, 4, 5, 10, 20 | 495, 720, 413, 0, 0 |
| 3 | 0, 6, 7, 8, 20 | 63, 163, 0, 767, 0 |
| 4 | 1, 3, 4, 10, 29 | 629, 319, 818, 0, 0 |
| 5 | 2, 6, 7, 8, 9 | 247, 412, 1023, 768, 0 |
| 6 | 2, 8, 11, 29 | 928, 0, 0, 0 |
| 7 | 0, 1, 13 | 32, 190, 0 |
| 8 | 0, 2, 14 | 243, 596, 0 |
| 9 | 1, 2, 3, 15 | 880, 833, 329, 0 |
| 10 | 0, 1, 4, 16 | 224, 840, 208, 0 |
| 11 | 2, 5, 9, 17 | 479, 222, 17, 0 |
| 12 | 0, 1, 6, 18 | 296, 856, 651, 0 |
| 13 | 2, 3, 8, 19 | 926, 211, 167, 0 |
| 14 | 0, 7, 13, 21 | 764, 166, 387, 0 |
| 15 | 1, 2, 10, 22 | 238, 925, 405, 0 |
| 16 | 3, 4, 14, 23 | 850, 922, 852, 0 |
| 17 | 0, 1, 5, 24 | 412, 96, 627, 0 |
| 18 | 0, 2, 11, 25 | 536, 443, 773, 0 |
| 19 | 1, 2, 12, 26 | 551, 91, 400, 0 |
| 20 | 0, 3, 6, 27 | 567, 242, 205, 0 |
| 21 | 1, 2, 8, 28 | 556, 157, 27, 0 |
| 22 | 0, 9, 30 | 10, 886, 0 |
| 23 | 1, 2, 20, 31 | 831, 252, 11, 0 |
| 24 | 0, 3, 4, 32 | 755, 623, 867, 0 |
| 25 | 1, 7, 33 | 608, 72, 0 |
| 26 | 0, 2, 10, 34 | 60, 516, 772, 0 |
| 27 | 1, 3, 5, 35 | 289, 906, 292, 0 |
| 28 | 2, 6, 36 | 600, 48, 0 |
| 29 | 0, 11, 37 | 565, 458, 0 |
| 30 | 0, 4, 8, 38 | 428, 6, 413, 0 |
| 31 | 1, 12, 39 | 958, 131, 0 |
| 32 | 2, 5, 40 | 577, 146, 0 |
| 33 | 1, 4, 6, 41 | 734, 257, 619, 0 |
| 34 | 2, 8, 42 | 612, 634, 0 | and wherein the row permutation pattern ($Q_i$) and the column permutation pattern ($P_i$) are of the following table:

| $Q_i$ | $P_i$ |
|---|---|
| 11 3 1 13 9 5<br>7 10 2 12 8 4<br>6 | 0 1 2 3 4 5 6 7 8 9 10 11 12 13 14 16 17 19 25 23 59 21 41<br>15 18 24 22 58 20 40 26 27 28 29 30 31 32 33 34 35 36 37<br>38 39 42 43 44 45 46 47 48 49 50 51 52 53 54 55 56 57 60<br>61 62 63 64 65 66 67 68 69 70 71 72 73 74 75 76 77 78 79<br>80 81 82 83 84 85. |

5. The method of claim 1, wherein the first base matrix is defined by the following table:

| Row Index | Column Positions of non-NULL Indexes in Row | Shift Numbers of non-NULL Indexes in Row |
|---|---|---|
| 0 | 1, 3, 5, 11, 21 | 854, 545, 457, 0, 0 |
| 1 | 0, 6, 8, 9, 21 | 282, 1001, 0, 767, 0 |
| 2 | 2, 5, 6, 12, 23 | 984, 677, 794, 0, 0 |
| 3 | 1, 4, 7, 11, 23 | 169, 618, 313, 0, 0 |
| 4 | 2, 3, 6, 13, 25 | 129, 699, 370, 0, 0 |
| 5 | 0, 4, 9, 12, 25 | 156, 934, 0, 0, 0 |
| 6 | 1, 4, 7, 13, 26 | 923, 840, 117, 0, 0 |
| 7 | 0, 3, 5, 10, 26 | 538, 243, 83, 0, 0 |
| 8 | 2, 7, 8, 9, 10 | 464, 1009, 1023, 768, 0 |
| 9 | 0, 1, 14 | 259, 434, 0 |
| 10 | 0, 1, 2, 15 | 274, 901, 1004, 0 |
| 11 | 0, 2, 14, 16 | 640, 997, 988, 0 |
| 12 | 1, 2, 10, 17 | 683, 54, 385, 0 |
| 13 | 0, 3, 4, 18 | 679, 253, 646, 0 |
| 14 | 1, 5, 6, 19 | 47, 418, 332, 0 |
| 15 | 2, 7, 9, 20 | 343, 26, 175, 0 |
| 16 | 0, 8, 15, 22 | 514, 671, 496, 0 |
| 17 | 1, 2, 11, 24 | 972, 433, 993, 0 |
| 18 | 0, 1, 12, 27 | 235, 223, 885, 0 |
| 19 | 0, 2, 13, 28 | 555, 943, 892, 0 |
| 20 | 1, 2, 21, 29 | 696, 574, 233, 0 |
| 21 | 0, 1, 23, 30 | 975, 510, 815, 0 |
| 22 | 0, 3, 4, 31 | 5, 818, 898, 0 |
| 23 | 2, 5, 32 | 350, 159, 0 |
| 24 | 0, 3, 6, 33 | 36, 397, 807, 0 |
| 25 | 1, 3, 7, 34 | 492, 502, 467, 0 |
| 26 | 1, 9, 35 | 162, 631, 0 |
| 27 | 2, 3, 10, 36 | 608, 944, 599, 0 |
| 28 | 2, 8, 37 | 394, 630, 0 |
| 29 | 0, 11, 38 | 48, 576, 0 |
| 30 | 1, 4, 10, 39 | 952, 521, 455, 0 |
| 31 | 2, 12, 40 | 304, 300, 0 |
| 32 | 0, 4, 5, 41 | 982, 602, 915, 0 |
| 33 | 1, 6, 42 | 740, 710, 0 |
| 34 | 0, 4, 7, 43 | 783, 491, 307, 0 |
| 35 | 1, 13, 44 | 431, 275, 0 |
| 36 | 2, 3, 5, 45 | 802, 46, 83, 0 |
| 37 | 2, 9, 46 | 556, 239, 0 |
| 38 | 4, 6, 47 | 812, 72, 0 | and wherein the row permutation pattern ($Q_i$) and the column permutation pattern ($P_i$) are of the following table:

| $Q_i$ | $P_i$ |
|---|---|
| 17 15 13 9 | 0 1 2 3 4 5 6 7 8 9 10 11 12 13 14 15 16 18 19 21 53 27 51 |
| 11 5 7 1 3 16 | 25 47 23 43 17 20 52 26 50 24 46 22 42 28 29 30 31 32 33 |
| 14 12 8 10 4 | 34 35 36 37 38 39 40 41 44 45 48 49 54 55 56 57 58 59 60 |
| 6 0 2 | 61 62 63 64 65 66 67 68 69 70 71 72 73 74 75 76 77 78 79 80 81 82 83 84 85 86 87 88 89 90 91 92 93 94 95. |

6. The method of claim 1, wherein the first base matrix is defined by the following table:

| Row Index | Column Positions of non-NULL Indexes in Row | Shift Numbers of non-NULL Indexes in Row |
|---|---|---|
| 0 | 0, 5, 6, 9, 10, 22 | 892, 146, 990, 0, 767, 0 |
| 1 | 1, 3, 4, 5, 12, 23 | 350, 577, 321, 15, 0, 0 |
| 2 | 2, 4, 7, 9, 10, 11 | 242, 771, 989, 1023, 768, 0 |
| 3 | 1, 3, 8, 12, 22 | 627, 183, 532, 0, 0 |
| 4 | 2, 7, 10, 13, 23 | 614, 847, 0, 0, 0 |
| 5 | 2, 7, 8, 14, 24 | 456, 923, 264, 0, 0 |
| 6 | 0, 5, 6, 13, 24 | 664, 365, 587, 0, 0 |
| 7 | 1, 3, 6, 14, 26 | 767, 882, 392, 0, 0 |
| 8 | 0, 4, 8, 11, 26 | 124, 908, 915, 0, 0 |
| 9 | 0, 1, 15 | 815, 184, 0 |
| 10 | 0, 1, 2, 16 | 476, 804, 646, 0 |
| 11 | 0, 2, 3, 17 | 6, 735, 10, 0 |
| 12 | 1, 2, 11, 18 | 512, 95, 710, 0 |
| 13 | 0, 4, 5, 19 | 949, 94, 860, 0 |
| 14 | 1, 6, 7, 20 | 191, 452, 860, 0 |
| 15 | 2, 8, 10, 21 | 455, 231, 802, 0 |
| 16 | 9, 15, 16, 25 | 489, 984, 736, 0 |
| 17 | 0, 1, 12, 27 | 555, 536, 777, 0 |
| 18 | 2, 3, 13, 28 | 527, 612, 534, 0 |
| 19 | 0, 1, 14, 29 | 21, 227, 461, 0 |
| 20 | 2, 3, 22, 30 | 897, 119, 618, 0 |
| 21 | 0, 4, 17, 31 | 530, 581, 453, 0 |
| 22 | 1, 2, 5, 32 | 977, 76, 139, 0 |
| 23 | 0, 4, 6, 33 | 407, 302, 832, 0 |
| 24 | 1, 2, 23, 34 | 616, 233, 419, 0 |
| 25 | 0, 3, 7, 35 | 294, 500, 831, 0 |
| 26 | 1, 8, 36 | 994, 254, 0 |
| 27 | 2, 3, 24, 37 | 278, 1001, 589, 0 |
| 28 | 0, 3, 10, 38 | 4, 69, 141, 0 |
| 29 | 1, 3, 26, 39 | 956, 629, 420, 0 |
| 30 | 2, 11, 40 | 422, 541, 0 |
| 31 | 0, 3, 9, 41 | 816, 663, 475, 0 |
| 32 | 1, 3, 12, 42 | 349, 1010, 663, 0 |
| 33 | 2, 13, 43 | 94, 922, 0 |
| 34 | 0, 4, 5, 44 | 354, 776, 356, 0 |
| 35 | 1, 6, 45 | 995, 494, 0 |
| 36 | 2, 4, 7, 46 | 271, 911, 178, 0 |
| 37 | 0, 8, 47 | 7, 393, 0 |
| 38 | 1, 4, 10, 48 | 535, 888, 24, 0 |
| 39 | 2, 14, 49 | 854, 792, 0 |
| 40 | 4, 5, 50 | 792, 143, 0 |
| 41 | 3, 22, 51 | 170, 761, 0 |
| 42 | 3, 4, 6, 52 | 427, 900, 106, 0 | and wherein the row permutation pattern ($Q_i$) and the column permutation pattern ($P_i$) are of the following table:

| $Q_i$ | $P_i$ |
|---|---|
| 5 17 15 11 | 0 1 2 3 4 5 6 7 8 9 10 11 12 13 14 15 16 17 18 20 21 23 53 |
| 13 9 3 7 14 | 29 49 27 47 25 45 19 22 52 28 48 26 46 24 44 30 31 32 33 |
| 16 14 10 12 | 34 35 36 37 38 39 40 41 42 43 50 51 54 55 56 57 58 59 60 |
| 8 2 6 0 | 61 62 63 64 65 66 67 68 69 70 71 72 73 74 75 76 77 78 79 80 81 82 83 84 85 86 87 88 89 90 91 92 93 94 95 96 97 98 99 100 101 102 103 104 105. |

7. The method of claim 1, wherein, the first base matrix is defined by the following table:

| Row Index | Column Positions of non-NULL Indexes in Row | Shift Numbers of non-NULL Indexes in Row |
|---|---|---|
| 0 | 1, 4, 8, 9, 13, 20 | 572, 998, 930, 221, 0, 0 |
| 1 | 0, 5, 6, 10, 11, 20 | 340, 579, 789, 0, 767, 0 |
| 2 | 1, 3, 6, 7, 13, 25 | 368, 46, 358, 978, 0, 0 |
| 3 | 0, 4, 7, 9, 14, 26 | 921, 128, 589, 32, 0, 0 |
| 4 | 0, 4, 5, 8, 12, 27 | 757, 230, 714, 823, 0, 0 |
| 5 | 2, 3, 7, 10, 11, 12 | 729, 583, 1, 1023, 768, 0 |
| 6 | 2, 5, 8, 14, 25 | 997, 211, 438, 0, 0 |
| 7 | 2, 3, 11, 15, 26 | 418, 127, 0, 0, 0 |
| 8 | 1, 6, 9, 15, 27 | 598, 570, 943, 0, 0 |
| 9 | 0, 1, 16 | 847, 386, 0 |
| 10 | 0, 1, 2, 17 | 371, 107, 268, 0 |
| 11 | 0, 2, 3, 18 | 119, 226, 30, 0 |
| 12 | 1, 2, 12, 19 | 355, 74, 27, 0 |

-continued

| Row Index | Column Positions of non-NULL Indexes in Row | Shift Numbers of non-NULL Indexes in Row |
|---|---|---|
| 13 | 4, 5, 6, 21 | 310, 74, 15, 0 |
| 14 | 0, 7, 8, 22 | 394, 952, 73, 0 |
| 15 | 1, 2, 9, 23 | 55, 95, 768, 0 |
| 16 | 10, 11, 16, 24 | 912, 973, 727, 0 |
| 17 | 0, 13, 17, 28 | 697, 518, 709, 0 |
| 18 | 1, 3, 18, 29 | 226, 568, 330, 0 |
| 19 | 2, 4, 14, 30 | 41, 113, 948, 0 |
| 20 | 0, 3, 15, 31 | 31, 698, 549, 0 |
| 21 | 1, 4, 5, 32 | 262, 256, 243, 0 |
| 22 | 0, 2, 20, 33 | 574, 60, 651, 0 |
| 23 | 1, 5, 6, 34 | 946, 464, 986, 0 |
| 24 | 2, 6, 7, 35 | 684, 243, 20, 0 |
| 25 | 0, 3, 8, 36 | 541, 250, 136, 0 |
| 26 | 1, 2, 9, 37 | 265, 559, 896, 0 |
| 27 | 0, 4, 11, 38 | 699, 43, 320, 0 |
| 28 | 0, 1, 25, 39 | 24, 47, 193, 0 |
| 29 | 2, 26, 40 | 479, 995, 0 |
| 30 | 0, 5, 7, 41 | 44, 855, 57, 0 |
| 31 | 1, 2, 27, 42 | 150, 720, 179, 0 |
| 32 | 1, 3, 8, 43 | 168, 140, 985, 0 |
| 33 | 2, 12, 44 | 689, 429, 0 |
| 34 | 0, 4, 6, 45 | 515, 385, 75, 0 |
| 35 | 1, 5, 10, 46 | 75, 396, 1017, 0 |
| 36 | 0, 13, 47 | 31, 388, 0 |
| 37 | 1, 6, 7, 48 | 226, 123, 612, 0 |
| 38 | 2, 14, 49 | 509, 38, 0 |
| 39 | 2, 7, 8, 50 | 726, 430, 767, 0 |
| 40 | 3, 8, 51 | 838, 277, 0 |
| 41 | 4, 9, 52 | 383, 745, 0 |
| 42 | 3, 5, 53 | 772, 267, 0 |
| 43 | 6, 9, 54 | 270, 297, 0 |
| 44 | 4, 7, 55 | 743, 598, 0 |
| 45 | 5, 12, 56 | 66, 373, 0 |
| 46 | 3, 6, 8, 57 | 455, 973, 737, 0 | and wherein the row permutation pattern ($Q_i$) and the column permutation pattern ($P_i$) are of the following table:

| $Q_i$ | $P_i$ |
|---|---|
| 11 9 17 15 7 | 0 1 2 3 4 5 6 7 8 9 10 11 12 13 14 15 16 17 18 19 20 22 23 |
| 13 5 1 3 10 8 | 25 55 31 53 29 51 27 41 21 24 54 30 52 28 50 26 40 32 33 |
| 16 14 6 12 4 | 34 35 36 37 38 39 42 43 44 45 46 47 48 49 56 57 58 59 60 |
| 0 2 | 61 62 63 64 65 66 67 68 69 70 71 72 73 74 75 76 77 78 79 80 81 82 83 84 85 86 87 88 89 90 91 92 93 94 95 96 97 98 99 100 101 102 103 104 105 106 107 108 109 110 111 112 113 114 115. |

8. The method of claim 1, wherein a parity part of the fourth base matrix has a dual diagonal structure.

9. A method for encoding data using a parity check matrix, the method comprising:
generating a first base matrix including a plurality of indexes, the plurality of indexes including positive integers representing shift values;
generating a second base matrix by replacing each index of the plurality of indexes of the first base matrix with another index determined based on a flooring operation, wherein the second base matrix includes a second plurality of indexes, each index of the second plurality of indexes indicating a corresponding sub-matrix;
generating another base matrix by applying at least one of an index expansion or an index permutation to each index of the second base matrix, wherein the another base matrix includes another plurality of indexes, each index of the another plurality of indexes indicating a corresponding sub-matrix;
generating the parity check matrix by replacing each index of the another base matrix with the sub-matrix corresponding to the each index of the another plurality of indexes of the generated another base matrix; and
outputting an encoded bit stream by encoding an input bit stream using the generated parity check matrix.

10. The method of claim 9, wherein the another base matrix is generated by applying a row permutation pattern and a column permutation pattern to rows and columns of a third base matrix,
wherein the third base matrix is generated by expanding each index of the second base matrix into an index matrix including two or more indexes, and
wherein the third base matrix includes a third plurality of indexes, each index of the third plurality of indexes indicating a corresponding sub-matrix.

* * * * *